US011251621B1

(12) United States Patent
Hume et al.

(10) Patent No.: US 11,251,621 B1
(45) Date of Patent: Feb. 15, 2022

(54) SOLAR POWER GENERATION SYSTEM

(71) Applicant: Southwire Company, LLC, Carrollton, GA (US)

(72) Inventors: Charles Hume, Parrish, FL (US); David Sykes, Pinellas Park, FL (US); Aldo P. Della Sera, Saint Petersburg, FL (US); Juan Galindo, Powder Springs, GA (US); Andrew M. Pluister, Lake Barrington, IL (US); Mark Crosier, Ipswich (GB)

(73) Assignee: Southwire Company, LLC, Carrollton, GA (US)

( * ) Notice: Subject to any disclaimer, the term of this patent is extended or adjusted under 35 U.S.C. 154(b) by 348 days.

(21) Appl. No.: 16/054,625

(22) Filed: Aug. 3, 2018

Related U.S. Application Data

(60) Provisional application No. 62/540,951, filed on Aug. 3, 2017, provisional application No. 62/567,488, filed on Oct. 3, 2017.

(51) Int. Cl.
*H02S 40/32* (2014.01)
*H02J 3/38* (2006.01)
(Continued)

(52) U.S. Cl.
CPC ........ *H02J 3/383* (2013.01); *H01L 31/02021* (2013.01); *H02J 7/35* (2013.01); *H02S 40/32* (2014.12); *H02S 40/36* (2014.12)

(58) Field of Classification Search
CPC . H02J 3/00; H02J 2300/00; H02J 7/00; Y02E 10/00; H02S 40/00; H01L 31/02021
See application file for complete search history.

(56) References Cited

U.S. PATENT DOCUMENTS 6,111,767 A    8/2000   Handleman et al.
6,429,546 B1   8/2002   Ropp et al.
(Continued)

FOREIGN PATENT DOCUMENTS

CA    2906590 A1    9/2014
CN    104158394 A   11/2014
(Continued)

OTHER PUBLICATIONS

Microchip Technology Inc. *Grid-Connected Solar Microinverter Reference Design Using a dsPIC® Digital Signal Controller*, AN1338 Technical Bulletin, Jul. 2010, 56 pages, retrieved from <http://ww1.microchip.com/downloads/en/AppNotes/01338D.pdf> on Jul. 22, 2016.

(Continued)

*Primary Examiner* — Hal Kaplan
*Assistant Examiner* — Joseph N Inge
(74) *Attorney, Agent, or Firm* — Alston & Bird LLP

(57) ABSTRACT

A solar power generation system is provided for more efficiently and cost-effectively generating and delivering power. The solar power generation system includes a plurality of distributed power converter nodes each configured to convert DC power received from a solar module into a deadband DC waveform. The deadband DC power generated by each power converter node is then transmitted to a centralized grid interface box, which is configured to unfold the deadband DC waveform into an AC signal suitable for transmission to an electric power grid.

15 Claims, 17 Drawing Sheets

(51) Int. Cl.
*H01L 31/02* (2006.01)
*H02S 40/36* (2014.01)
*H02J 7/35* (2006.01)

(56) References Cited

U.S. PATENT DOCUMENTS

| | | | |
|---|---|---|---|
| 8,106,537 | B2 | 1/2012 | Casey et al. |
| 8,134,820 | B1 | 3/2012 | Riccio et al. |
| 8,207,637 | B2* | 6/2012 | Marroquin ........ H01L 31/02021 307/147 |
| 8,257,106 | B2 | 9/2012 | Fornage et al. |
| 8,410,950 | B2 | 4/2013 | Takehara et al. |
| 8,435,056 | B2 | 5/2013 | Fornage et al. |
| 8,472,220 | B2 | 6/2013 | Garrity et al. |
| 8,581,441 | B2 | 11/2013 | Rotzoll et al. |
| 8,626,616 | B2 | 1/2014 | Eich |
| 8,824,178 | B1 | 9/2014 | Baker et al. |
| 9,165,275 | B2 | 10/2015 | Fornage |
| 9,270,201 | B1* | 2/2016 | Potharaju ................ H02J 3/383 |
| 9,750,102 | B1 | 8/2017 | Mao et al. |
| 10,523,117 | B2* | 12/2019 | Hume ....................... H02J 1/00 |
| 2005/0128751 | A1 | 6/2005 | Roberge et al. |
| 2005/0200133 | A1* | 9/2005 | Wobben .................... H02J 3/40 290/55 |
| 2006/0002110 | A1 | 1/2006 | Dowling et al. |
| 2007/0247823 | A1 | 10/2007 | Falk et al. |
| 2008/0285317 | A1 | 11/2008 | Rotzoll |
| 2009/0275242 | A1* | 11/2009 | Erten ................. H01R 13/6585 439/660 |
| 2010/0066260 | A1 | 3/2010 | Newman, Jr. et al. |
| 2010/0071742 | A1 | 3/2010 | de Rooij et al. |
| 2010/0134959 | A1 | 6/2010 | Fife et al. |
| 2010/0141158 | A1 | 6/2010 | Newman, Jr. et al. |
| 2010/0145532 | A1* | 6/2010 | Gregory .................. H02J 3/386 700/286 |
| 2010/0263704 | A1 | 10/2010 | Fornage et al. |
| 2010/0289337 | A1 | 11/2010 | Stauth et al. |
| 2010/0307479 | A1 | 12/2010 | Park |
| 2011/0061705 | A1 | 3/2011 | Croft et al. |
| 2011/0090089 | A1 | 4/2011 | Luo |
| 2011/0103117 | A1 | 5/2011 | Yoneda |
| 2011/0121744 | A1 | 5/2011 | Salvestrini et al. |
| 2011/0202181 | A1 | 8/2011 | Lee et al. |
| 2011/0210611 | A1 | 9/2011 | Ledenev et al. |
| 2011/0225904 | A1 | 9/2011 | Railkar et al. |
| 2011/0248640 | A1 | 10/2011 | Welten |
| 2011/0273015 | A1 | 11/2011 | Adest et al. |
| 2011/0273016 | A1 | 11/2011 | Adest et al. |
| 2012/0019074 | A1 | 1/2012 | Frolov et al. |
| 2012/0080944 | A1 | 4/2012 | Recker et al. |
| 2012/0081934 | A1 | 4/2012 | Garrity et al. |
| 2012/0084027 | A1 | 4/2012 | Caine |
| 2012/0089260 | A1 | 4/2012 | Krohne et al. |
| 2012/0138123 | A1 | 6/2012 | Newdoll et al. |
| 2012/0175955 | A1 | 7/2012 | Carralero et al. |
| 2012/0175964 | A1 | 7/2012 | Yoscovich et al. |
| 2012/0248863 | A1 | 10/2012 | Adest et al. |
| 2012/0249150 | A1 | 10/2012 | Anissimov |
| 2012/0310427 | A1 | 12/2012 | Williams et al. |
| 2012/0313443 | A1 | 12/2012 | Cheng et al. |
| 2013/0002031 | A1 | 1/2013 | Mulkey et al. |
| 2013/0012061 | A1 | 1/2013 | Rotzoll et al. |
| 2013/0021006 | A1 | 1/2013 | Fornage |
| 2013/0049610 | A1 | 2/2013 | Chen |
| 2013/0049674 | A1 | 2/2013 | Davis |
| 2013/0113291 | A1 | 5/2013 | Recker et al. |
| 2013/0134891 | A1 | 5/2013 | Woytowitz |
| 2013/0225005 | A1 | 8/2013 | Fornage et al. |
| 2013/0241535 | A1 | 9/2013 | Magnussen et al. |
| 2013/0346054 | A1 | 12/2013 | Mumtaz |
| 2014/0077609 | A1 | 3/2014 | Fornage |
| 2014/0102755 | A1* | 4/2014 | Adriaenssens ........... H01B 1/04 174/113 R |
| 2014/0191583 | A1 | 7/2014 | Chisenga et al. |
| 2014/0265585 | A1 | 9/2014 | Della Sera et al. |
| 2014/0266289 | A1 | 9/2014 | Della Sera et al. |
| 2014/0361695 | A1 | 12/2014 | Akiyama et al. |
| 2014/0376270 | A1* | 12/2014 | Kern .................... H02M 3/3376 363/17 |
| 2015/0002040 | A1 | 1/2015 | Malyna et al. |
| 2015/0216002 | A1 | 7/2015 | Melanson et al. |
| 2015/0237700 | A1 | 8/2015 | Woytowitz |
| 2015/0244250 | A1 | 8/2015 | Toth et al. |
| 2016/0066386 | A1 | 3/2016 | Catalano et al. |
| 2016/0072396 | A1 | 3/2016 | Deboy et al. |
| 2016/0226252 | A1 | 8/2016 | Kravtiz et al. |
| 2016/0270174 | A1 | 9/2016 | Rimmer |
| 2016/0299555 | A1 | 10/2016 | Rucker et al. |
| 2017/0019960 | A1 | 1/2017 | Qu et al. |
| 2017/0027029 | A1 | 1/2017 | Hu et al. |
| 2017/0223807 | A1 | 8/2017 | Recker et al. |
| 2017/0231058 | A1 | 8/2017 | Sadwick |
| 2017/0238401 | A1 | 8/2017 | Sadwick et al. |
| 2019/0280895 | A1* | 9/2019 | Mather .................. H04L 41/12 |

FOREIGN PATENT DOCUMENTS

| | | |
|---|---|---|
| EP | 2973976 B1 | 1/2016 |
| JP | H10174452 A | 6/1998 |
| JP | 2001238466 A | 8/2001 |
| WO | WO-2003/077398 A2 | 9/2003 |
| WO | WO-2012/170726 A2 | 12/2012 |
| WO | WO-2013/107782 A2 | 7/2013 |
| WO | WO-2014/152765 A2 | 9/2014 |

OTHER PUBLICATIONS

Roos et al., *Solar Electric System Design, Operation and Installation*, Washington State University Extension Energy Program, Oct. 2009, (35 pages). [Retrieved from the Internet Aug. 6, 20196] <www.energy.wsu.edu/Documents/SolarPVforBuildersOct2009.pdf>.

Vu, Trune-Kien et al., "A New Adaptive Dead-Time Compensation for Single-Phase Grid-Connected PV Inverter," Proceeding of 26th Annual Applied Power Electronics Conference and Exposition (APEC), Mar. 6, 2011, pp. 923-930, IEEE, U.S.

European Patent Office, Communication Pursuant to Rules 161(2) and 162 EPC for Application No. 14770361.5, dated Nov. 5, 2015, 2 pages. Germany.

European Patent Office, Extended European Search Report for Application No. 14770361.5, dated Nov. 24, 2016, 9 pages. Germany.

European Patent Office, Communication Pursuant to Rules 70(2) and 70a(2) EPC for Application No. 14770361.5, dated Dec. 13, 2016, 1 page. Germany.

European Patent Office, Communication Under Rule 71(3) EPC for Application No. 14770361.5, dated Nov. 14, 2018, 61 pages. Germany.

International Searching Authority, International Search Report and Written Opinion for International Application No. PCT/US2014/027708, dated Oct. 2, 2014, 24 pages, United States Patent and Trademark Office, U.S.A.

In International Bureau of WIPO, International Preliminary Report on Patentability for International Application No. PCT/US2014/027708, dated Sep. 15, 2015, 22 pages, Switzerland.

Internattonai Searching Authority, International Search Report and Written Opinion for International Application No. PCT/US2016/016059, dated Jun. 27, 2016, 14 pages, The Netherlands.

International Searching Authority, International Search Report and Written Opinion for International Application No. PCT/US2016/067556, dated Mar. 16, 2017, 15 pages, The Netherlands.

International Searching Authority, International Search Report and Written Opinion for International Application No. PCT/US2017/060428, dated Feb. 7, 2018, 15 pages, European Patent Office, The Netherlands.

United States Patent and Trademark Office, Office Action for U.S. Appl. No. 14/211,693, dated Mar. 11, 2016, 7 pages, U.S.A.

United States Patent and Trademark Office, Office Action for U.S. Appl. No. 14/211,693, dated Dec. 29, 2016, 8 pages, U.S.A.

(56) References Cited

OTHER PUBLICATIONS

United States Patent and Trademark Office, Office Action for U.S. Appl. No. 14/211,693, dated Apr. 21, 2017, 12 pages, U.S.A.
United States Patent and Trademark Office, Office Action for U.S. Appl. No. 16/100,961, dated Mar. 22, 2019, 19 pages, U.S.A.
United States Patent and Trademark Office, Office Action for U.S. Appl. No. 15/383,647, dated May 1, 2019, 12 pages, U.S.A.
United States Patent and Trademark Office, Notice of Allowance for U.S. Appl. No. 14/058,270, dated Sep. 23, 2016, 12 pages, U.S.A.
United States Patent and Trademark Office, Corrected Notice of Allowability for U.S. Appl. No. 14/058,270, dated Dec. 28, 2016, 3 pages, U.S.A.
United States Patent and Trademark Office, Office Action for U.S. Appl. No. 14/612,159, dated Jan. 3, 2017, 17 pages, U.S.A.
United States Patent and Trademark Office, Notice of Allowance for U.S. Appl. No. 15/425,767, dated Sep. 14, 2018, 13 pages, U.S.A.
U.S. Appl. No. 61/270,809, "Method and System for Locating Stolen Solar Power System Components", Unpublished (filed Jul. 14, 2009), (Martin Fronage, Inventor and Assignee).
Argentine Patent and Trademark Office, Office Action for Argentine Patent Application No. 200140101267, dated Mar. 11, 2019, 5 pages, Argentina.
Mexican Patent Office, Office Action for Mexican Patent Application No. MX/a/2015/012438, dated Dec. 4, 2017, 2 pages, Mexico.
Mexican Patent Office, Notice of Allowance for Mexican Patent Application No. MX/a/2015/012438, dated Jun. 11, 2018, 1 page, Mexico.
Chilean Patent and Trademark Office, Written Opinion for Chilean Patent Application No. 201502718, dated Jan. 15, 2018, 11 pages, Chile.
NonFinal Office Action for U.S. Appl. No. 16/100,961, dated Nov. 22, 2019, (18 pages), United States Patent and Trademark Office, USA.
Final Office Action for U.S. Appl. No. 16/100,961, dated Jun. 11, 2020, (13 pages), United States Patent and Trademark Office, USA.
Notice of Allowance for U.S. Appl. No. 16/100,961, dated Jan. 15, 2021, (7 pages), United States Patent and Trademark Office, USA.
Supplemental Notice of Allowability for U.S. Appl. No. 16/100,961, dated Feb. 24, 2021, (4 pages), United States Patent and Trademark Office, USA.
NonFinal Office Action for U.S. Appl. No. 17/174,771, dated Nov. 8, 2021, (23 pages), United States Patent and Trademark Office, USA.

* cited by examiner

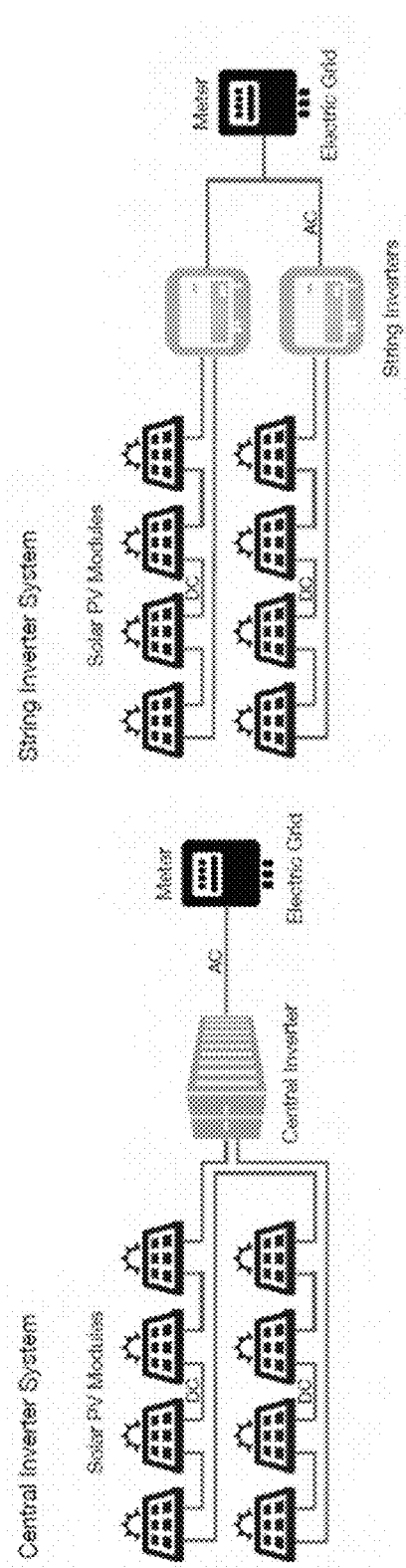
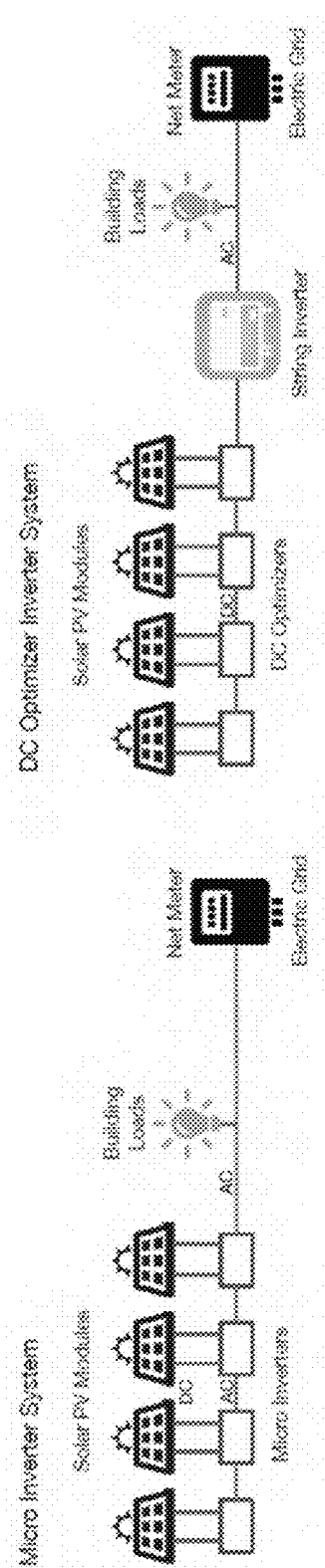
FIG. 1A
FIG. 1B
FIG. 1C
FIG. 1D

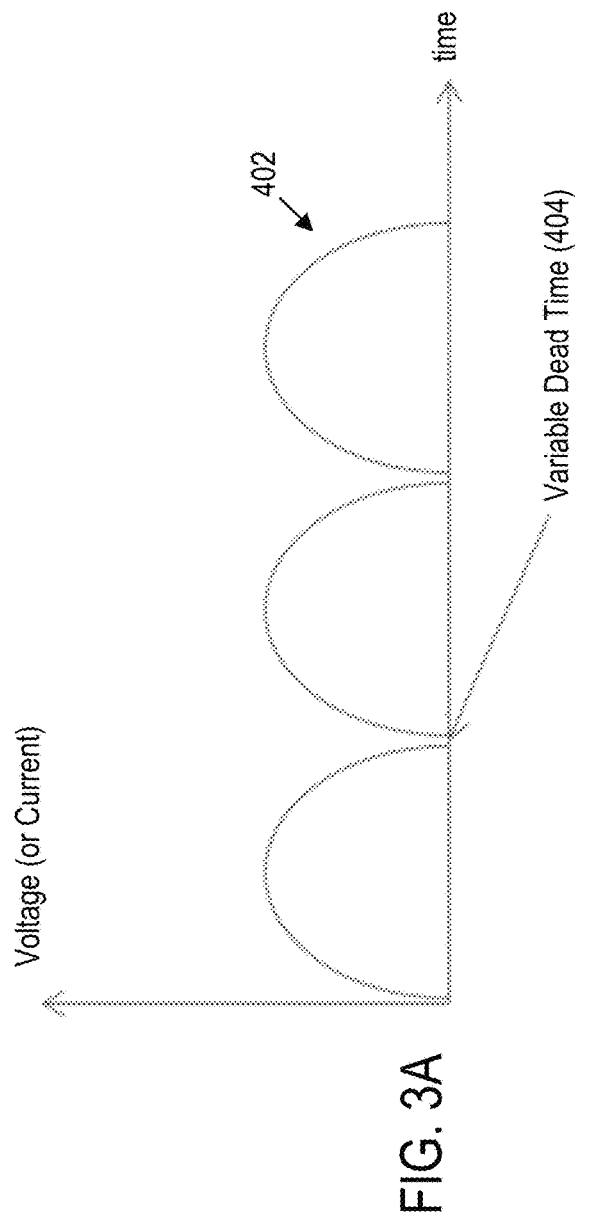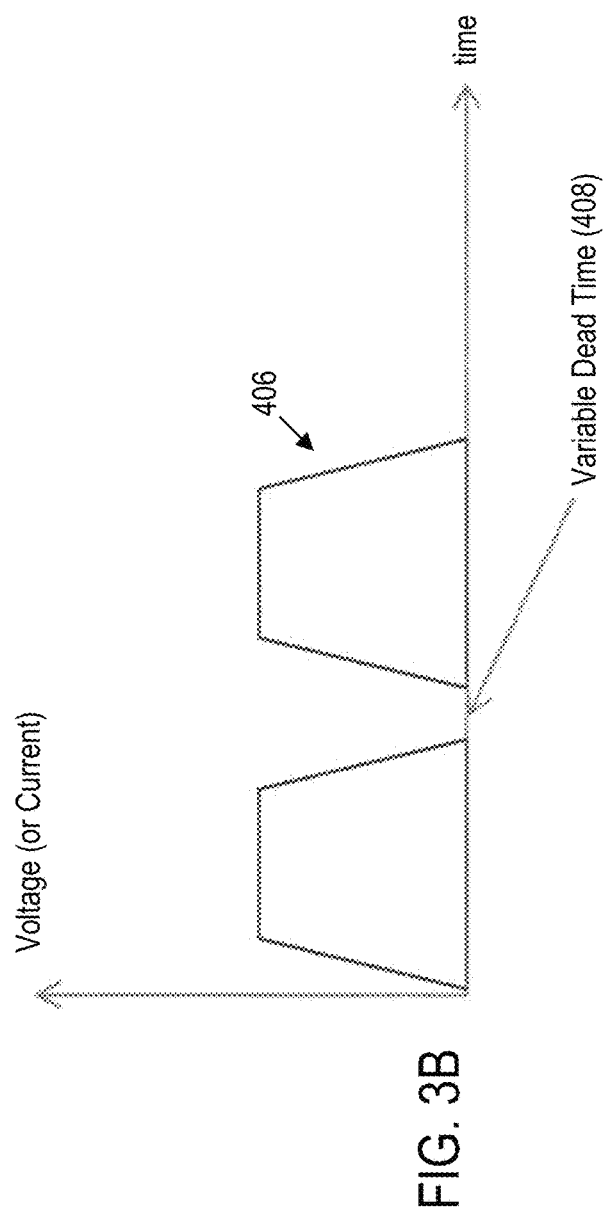
FIG. 3A
FIG. 3B

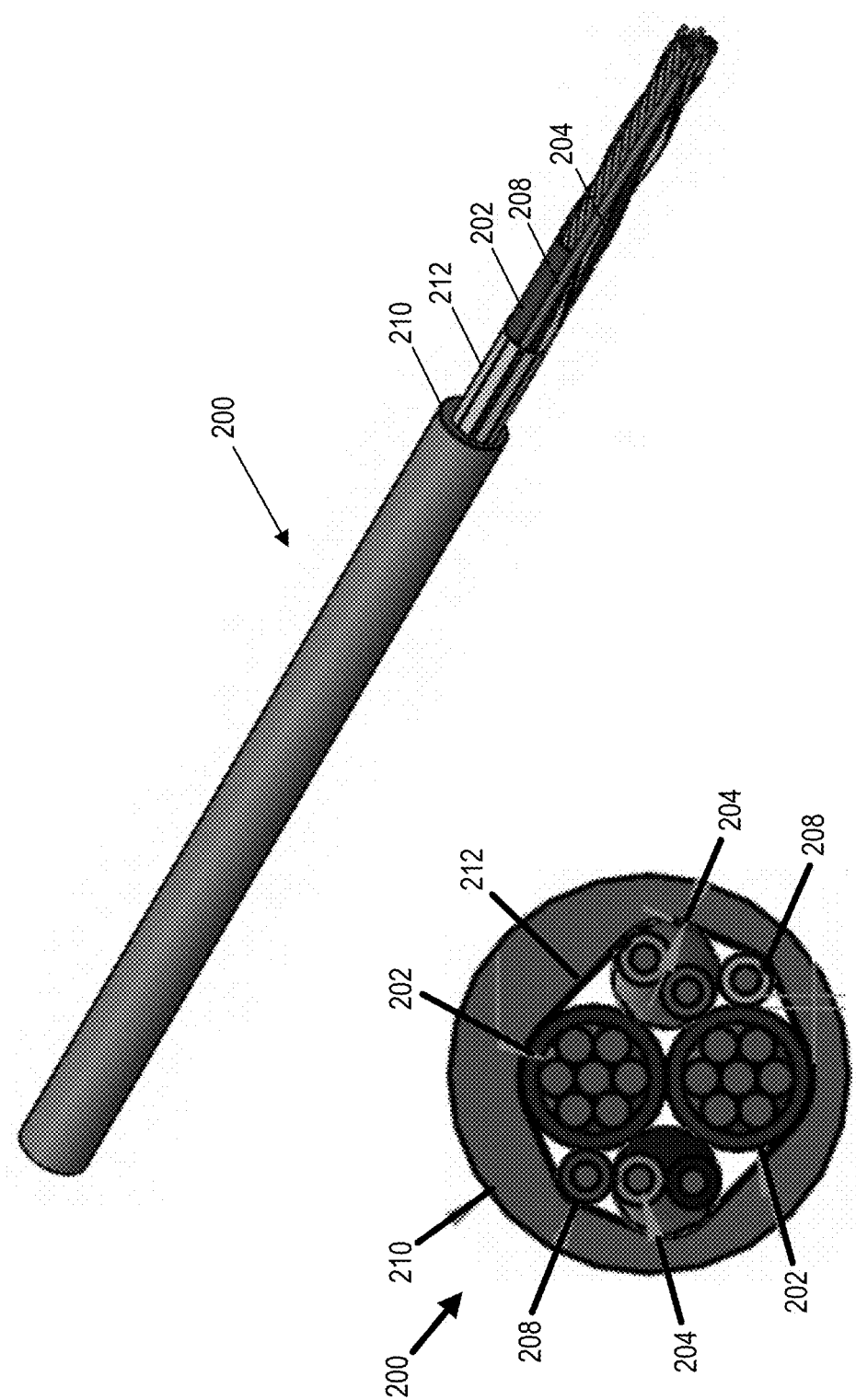

SOLAR POWER GENERATION SYSTEM

CROSS-REFERENCE TO RELATED APPLICATIONS

This application claims priority to and the benefit of U.S. Provisional Patent Application No. 62/540,951, filed Aug. 3, 2017, and U.S. Provisional Patent Application No. 62/567,488, filed Oct. 3, 2017; the contents of both of which are hereby incorporated by reference in their entirety.

BACKGROUND

Photovoltaic (PV) power is one of the world's fastest growing renewable energy resources. In order to continue this growth trend, however, access to solar power must be improved in residential, commercial, and utility-scale sectors. In each of these power consumption sectors, the cost per watt of solar power generated is paramount. If the cost per watt of a given solar power generation system is uncompetitive with traditional power generation sources in the same sector, the solar power system becomes inaccessible and/or commercially unviable to the majority of power consumers in that sector. As a result, growth of PV-based power systems is dependent on the continued reduction of the cost per watt for power generated by these systems.

The cost per watt associated with solar power generation systems is tied to almost all elements of the system. As just some examples, costs associated with the production and sale of solar power system components, the installation of those components, and the on-going maintenance of those components each impact the cost per watt of the overall system. Likewise, the electrical efficiency of the system in harvesting and transmitting usable power significantly impacts the cost-per-watt of the system as a whole. Innovations relating to any aspect of a solar power system that provide improvements to any or all of these cost centers can lead to reductions in system cost-per-watt. Indeed, numerous aspects of existing solar power systems—beyond solar panels themselves—are ripe for improvement.

Solar panels are designed to use the photovoltaic effect to convert photons emitted by the sun into direct current (DC) power. However, in order to produce power useable for most existing environments, the DC power output by the solar panels must be converted into alternating current (AC) power. The DC to AC conversion of solar generated power is conventionally accomplished by an inverter, which can implemented into a power generation system in a variety of ways.

For systems configured to interface with the electric grid, inverters are generally implemented into solar power generation systems with a centralized or module-level architecture. In a fully centralized configuration, an example of which is shown in FIG. 1A, a single inverter is positioned between strings of solar modules and the electric grid. In this configuration, each string of solar modules delivers DC power to the centralized inverter, which then converts the collectively input DC power into AC power output. The AC power output is then transmitted to the grid. As a result, centralized inverter systems are sometimes referred to as "string inverter" systems. A similar configuration is shown in FIG. 1B, which illustrates a semi-centralized string inverter configuration using multiple inverters (as opposed to one). In this configuration, each inverter is again positioned between strings of solar modules and the electric grid. Each inverter converts the DC power received from its respective string of solar modules, converts that input power to AC, and delivers the AC power—along with the other inverters—to the electric grid.

Centralized and semi-centralized string inverter systems are used in a wide array of environments from solar farms to residential applications. By connecting inverters to strings of solar modules, the number of inverters needed is reduced and the ease of installation for the inverters is improved. These systems, however, have a number of drawbacks and limitations.

Solar modules strings are limited at any given time by the least productive module in the string. In other words, a given solar module string will only produce as much power as the least productive module. In environments where certain solar modules might be shaded while others are not (e.g., large strings or strings having modules facing different directions), this can significantly reduce the efficiency with which the solar modules can harvest energy. Moreover, string inverter architectures are more susceptible to losses in power generation when a solar module is damaged or otherwise not functioning properly.

A further disadvantage of string inverter systems is their lack of control at the solar module level. For example, conventional string inverters can only track maximum power (e.g., as part of an MPPT algorithm) down to the string level as opposed to the panel level. If there is a weak module in the string, the weakened module will limit the amount of power that can be extracted from the string of modules. Additionally, when solar modules are stacked, high voltage potentials (e.g., 600-2000V) can be reached and remain present even when the inverter is off. These high voltage potentials can present a fire hazard if any of the electrical connections in the solar array become loose or damaged, which necessitates additional hardware close to the module to mitigate against this risk.

String inverters also have inherent inefficiencies resulting from high voltage transistors that must be used to synthesize sine waves. In particular, the high voltage of the solar module string (e.g., 600-2000V as noted above) requires high voltage MOSFETs or IGBTs in the string inverter. The MOSFETs and IGBTs must switch at high frequencies, which generates more heat losses that a comparably low voltage MOSFET. The high voltage devices also require larger inductors and capacitors. As a result, string inverter systems are limited with respect to their efficiency in inverting power from solar modules.

FIGS. 1C and 1D illustrate examples of existing module-level architectures. In particular, FIG. 1C shows a micro-inverter system architecture in which inverters are provided for each solar module in the system. These "micro" inverters are typically installed on the back of modules of solar panels, integrated as part of the modules themselves, or otherwise provided proximate to the modules. Each micro-inverter is configured to convert the DC power received from its respective solar panel into AC power, which is then transmitted from the inverter to the electric grid. Micro-inverter architectures are popular in residential environments where the total number of solar modules is lower. As a result, the micro-inverter architecture may in some circumstances be configured to deliver AC power harvested from various inverters directly to a building load as indicted in FIG. 1C.

FIG. 1D illustrates another module-level architecture in which DC optimizers are provided at each solar module. In this DC optimizer inverter system, each DC optimizer is configured to condition the DC power received from its respective solar module and transmit this conditioned DC power to a string inverter provided between the optimizers and electric grid. Although the system makes use of a string inverter, the DC optimizers are provided in the system at the module-level analogously the aforementioned micro-inverters.

These module-level architectures are popular in residential applications and other environments where less modules are used. Because of the module-level nature of these systems, they are better suited for environments susceptible to shading. In particular, both micro-inverter and DC optimizer systems allow for optimization module-by-module and, as a result, are typically more efficient than a string inverter system using the same number of modules. These module-level architectures also have a number of drawbacks and limitations.

As an example, both micro-inverter and DC optimizer systems are more costly than comparable string inverter systems. In micro-inverter systems, each micro-inverter requires a full array of electronics necessary to convert DC power from solar modules into AC, including large transformers and extra transistors. Moreover, an individual micro-inverter is provided for each solar module, increasing not only the total cost of componentry but also significantly increasing the cost and complexity of installation. In DC optimizer systems, the presence of optimizers themselves increases the cost of system components and installation cost. In addition, DC optimizer systems still require high voltage MOSFETs or IGBTS along with large magnetics to convert DC to AC power, thereby reducing efficiency of the overall system. Furthermore, DC electric transmission and distribution systems are highly susceptible to arc faults, due to the nature of DC transmission. To protect against potential hazards from arc faults, including the risk of fire and the risk of electric shock, conventional DC systems require large and expensive protection equipment, such as DC-rated circuit breakers. Those working on DC systems must also wear substantial personal safety equipment for protection.

Accordingly, for at least these reasons, there is on-going need in the art for a more cost-effective, efficient, and reliable solar power generation system.

BRIEF DESCRIPTION OF THE DRAWINGS

Reference will now be made to the drawings, which are not necessarily drawn to scale, and wherein:

FIGS. 1A-1D show schematic representations of various existing solar power generation systems;

FIG. 3A shows a deadband DC waveform generated by a power converter node from the DC power received from a solar module according to one embodiment;

FIG. 3B shows a deadband DC waveform generated by a power converter node from the DC power received from a solar module according to another embodiment;

FIGS. 8A and 8B show cross-sectional and isometric cut-away views of the power-with-Ethernet cable of FIG. 7 according to one embodiment;

DETAILED DESCRIPTION OF VARIOUS EMBODIMENTS

Figure 2:
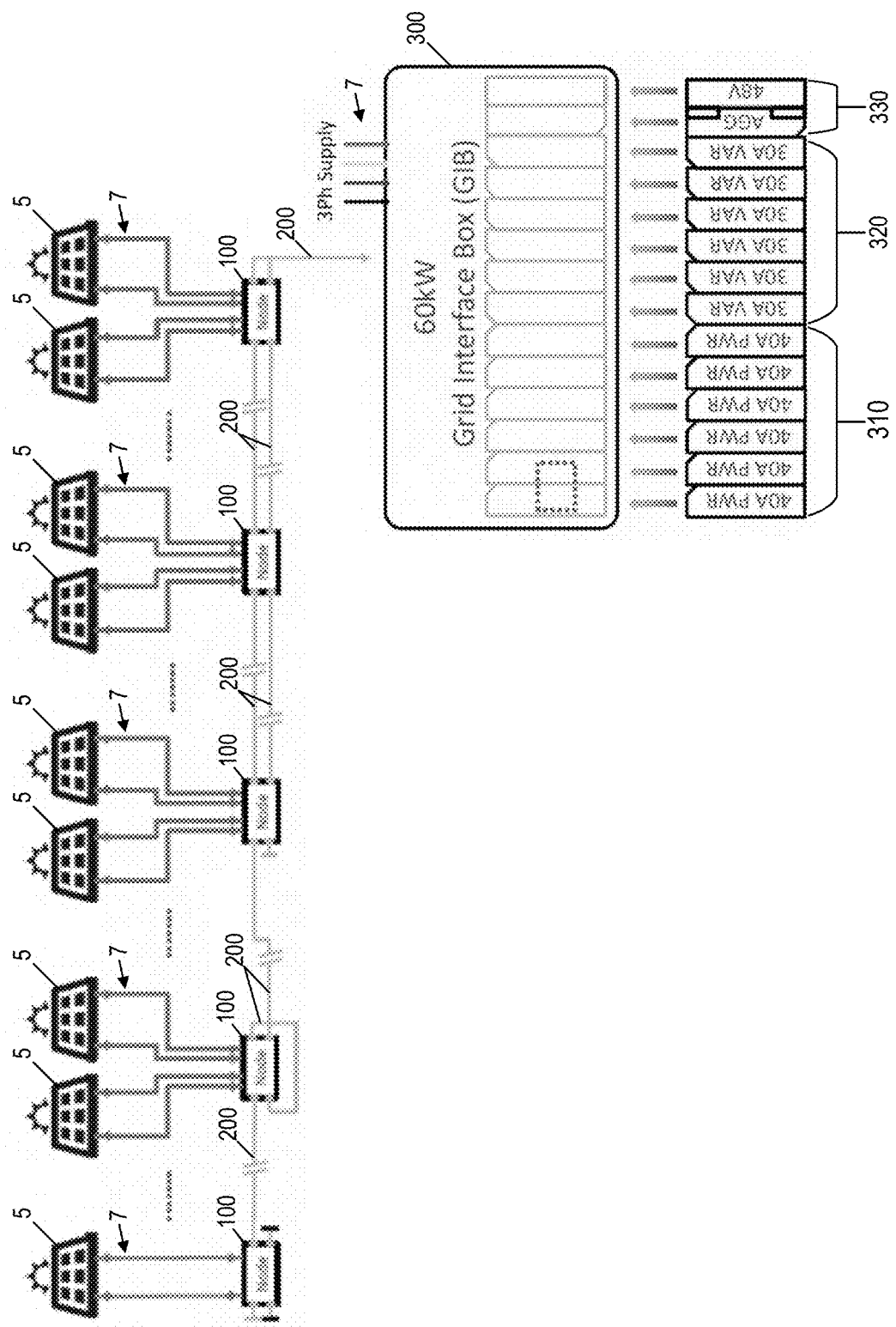
FIG. 2 shows a schematic diagram of a solar power generation system having distributed power converter nodes according to one embodiment.

Various embodiments of the present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. The term "or" is used herein in both the alternative and conjunctive sense, unless otherwise indicated. Like numbers refer to like elements throughout.

Various embodiments of the present invention are directed to a solar power generation system configured to more efficiently and cost-effectively generate power. According to various embodiments, the solar power generation system includes a plurality of distributed power converter nodes each configured to convert DC power received from a solar module into a deadband DC waveform. The deadband DC power generated by each node is then transmitted to a centralized grid interface box (GIB) configured to unfold the deadband DC waveform into an AC signal suitable for transmission to an electric power grid.

As explained in greater detail herein, the use of distributed power converter nodes configured for producing a deadband DC waveform improves the efficiency and cost-effectiveness of the solar power generation system. For example, as the power converter nodes do not require all of the electronics necessary to convert DC power received from a solar module in to a full AC power signal, the power converter nodes are smaller and lower-cost than existing micro-inverters. In addition, because the power converter nodes use fewer switching devices that conventional micro-inverters, they will incur less switching losses and provide improved efficiency. Furthermore, because the power converters are configured to convert DC power into a deadband DC waveform—which includes regular periods of zero-voltage dead time—the transmission of power from the power converters to the GIB presents a reduced risk of arcing, thereby improving the safety of the system as a whole.

In various embodiments, the distributed power converter nodes are connected to one another—and ultimately to the GIB—by power-with-Ethernet (PWE) cables and connectors. The power-with-Ethernet cables are each comprised, for example, of two power conductor cables, two twisted pairs of data communication cables, and two additional untwisted data communication cables. As explained in greater detail herein, the inclusion of separate power and data communication cables within the PWE cable enables efficient transmission of power alongside uninterrupted data communication. As an example, the use of PWE cables in the solar generation system enables quick and efficient power converter node synchronization. Most distributed architectures use either wireless RF communication or Power Line Carrier Communication (PLCC). However, because the PWE cable provides a dedicated hardwired communication line between the power converter nodes and the GIB, synchronization between the power converter nodes can be performed more quickly and at a lower cost. More broadly, the use of permanent communication wires enables the power converter nodes and GIB to communicate using higher bandwidth protocols, such as Ethernet. As a result, larger amounts of data can be exchanged as compared with lower bandwidth protocols, such as PLCC. Moreover, well-defined protocols developed for the internet can be used to ensure network security across the solar power generation system.

Additionally, various embodiments of the GIB provided in the solar power generation system are provided with a modular configuration that enables the GIB to be easily scaled for different applications. As explained in greater detail herein, the GIB is provided with removable power and VAR modules, which can be added and removed into the GIB's chassis as needed in order to provide the necessary capacity for converting deadband DC power routed to the GIB into AC power suitable for supply to the grid. For this reason, each individual GIB unit can be used in a variety of solar power generation systems, including both small-scale (e.g., residential) and large-scale (e.g., solar farm) systems.

FIG. 2 shows a schematic diagram of a solar power generation system according to one embodiment of the present invention. In the illustrated embodiment of FIG. 2, the solar power generation system is generally comprised of a plurality of solar modules 5, a plurality of power converter nodes 100, and grid interface box (GIB) 300. As explained in detail herein, the solar modules 5 are generally configured to convert solar energy into DC power. The power converter nodes 100 are generally configured to convert DC power received from the solar modules 5 into a deadband DC waveform, which is transmitted to the GIB 300. The GIB 300 is configured to unfold the deadband DC waveform transmitted by the power converter nodes 100 and output AC power suitable for supply to an electric power grid. Each of these components of the solar power generation system will now be described in greater detail.

According to various embodiments, the solar modules 5 each comprise a plurality of solar panels configured to convert solar energy into DC power output. In one embodiment, the solar modules 5 are each configured to output approximately 300 watts of power at 30 volts. However, as will be appreciated from the description herein, solar modules configured to output a variety of wattages can be implemented in the present invention. As shown in FIG. 2, each solar module 5 is connected to a power converter node 100 by power cables 7. In one embodiment, the power cables 7 may comprise PV rated cables having MC4 connectors. However, as will be appreciated form the description herein, any electrical cable and connector suitable for transmitting DC power from a solar module 5 to a power converter node 100 may be used.

According to various embodiments, the solar modules 5 depicted in FIG. 2 may represent a plurality of modules installed in any solar power production environment. As just some examples, the solar modules 5 may represent a plurality of modules mounted on a residential home, a plurality of modules installed for powering a commercial or industrial building, or a plurality of modules forming a large scale solar power station. As discussed in greater detail herein, each solar module 5 may be connected to an individual power converter node 100 or, in various other embodiments, multiple solar modules 5 may be connected (e.g., in series) to an individual power converter node 100.

According to various embodiments, the solar power generation system's power converter nodes 100 are each generally configured to receive DC power generated by one or more solar modules 5 and convert the received DC power into a deadband DC waveform. As an example, FIG. 3A illustrates a deadband DC waveform 402 generated by a power converter node 100 from the DC power received from a solar module 5 according to one embodiment. As shown in FIG. 3A, the deadband DC waveform 402 is a rectified sinewave having periods of dead time 404—e.g., zero voltage—between the peaks of the rectified sinewave. Unlike an AC waveform, the deadband DC waveform 402 does not cross zero voltage. However, because the waveform 402 includes regular deadbands 404 of zero voltage, an arc developing in the solar generation system will extinguish during the deadband period 404. As a second example, FIG. 3B illustrates a deadband DC waveform 406 generated by a power converter node 100 from the DC power received from a solar module 5 according to another embodiment. As shown in FIG. 3B, the deadband DC waveform 406 is a modified trapezoidal waveform and—like the waveform 402—includes deadband periods 408 between its peaks.

Figure 4:
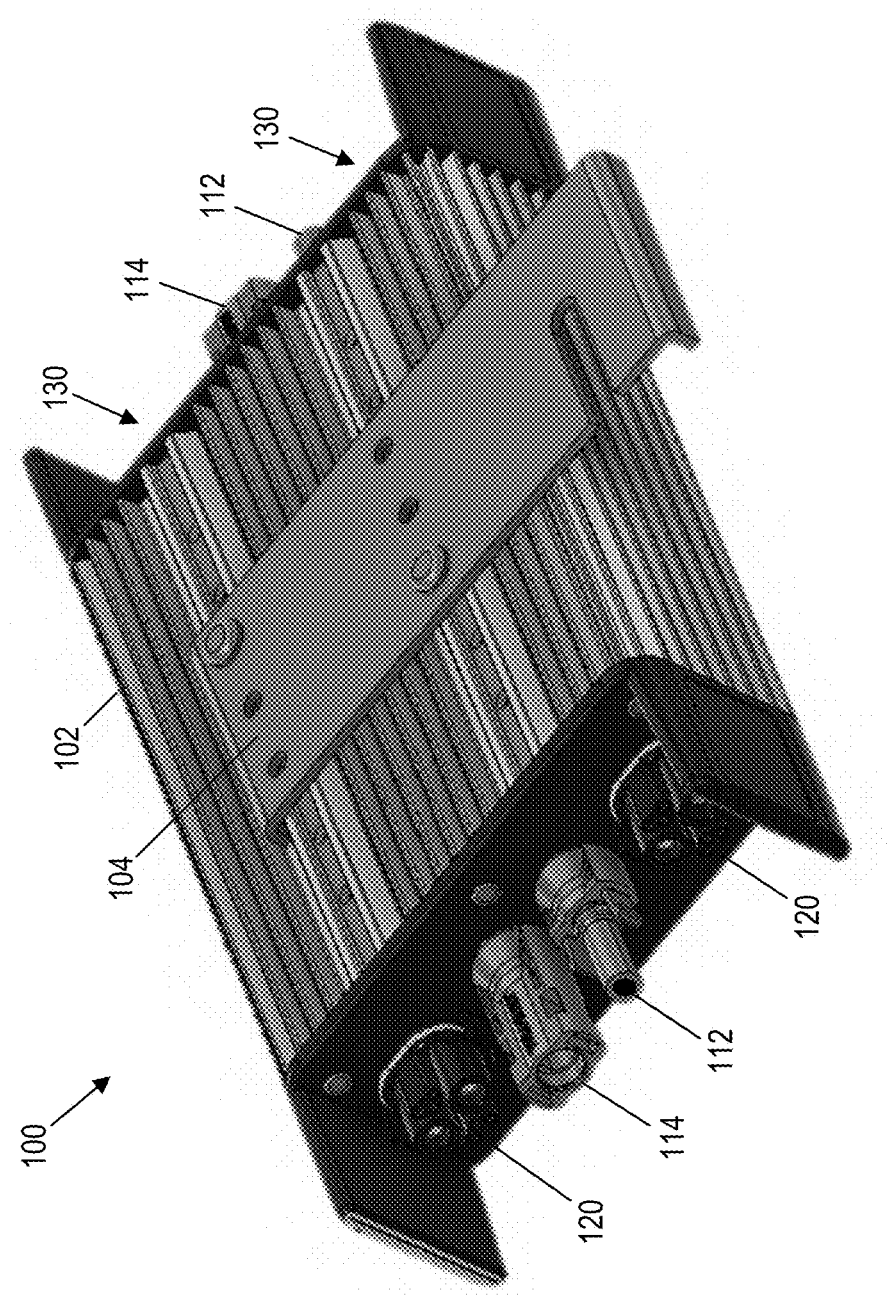
FIG. 4 shows a power converter node according to one embodiment.

FIG. 4 illustrates a power converter node 100 according to one embodiment. As shown in FIG. 4, the power converter node 100 includes a housing 102, within which the power converter's electronic components (discussed in more detail herein) are positioned. In the illustrated embodiment, the housing 102 includes a body portion formed with a plurality of heat dissipating fins (e.g., formed from extruded aluminum). According to various embodiments, the housing 102 may be constructed from a thermally conductive material (e.g., metals, metal alloys, thermally conductive plastic, a combination of plastics and metals and/or the like). In addition, a mounting bracket 104 is secured to the housing 102. According to various embodiments, the mounting bracket 104 is configured to enable the power converter 100 to be mounted directly to a respective solar module 5 or other surface proximate to the solar modules 5.

As shown in FIG. 4, a plurality of electrical connectors are provided on opposite ends of the power converter node's housing 102. At its first end, the power converter node 100 includes a female electrical connector 112 and a male electrical connector 114. According to various embodiments, the electrical connectors 112, 114 are input power connectors configured to be secured to power cables 7 in order to facilitate transmission of DC power generated by a solar module 5 to the power converter node 100. As just one example, in the illustrated embodiment shown in FIG. 3, the electrical connectors 112, 114 are MC4 connectors. As shown in FIG. 4, a second end of the power converter node 100 includes a second pair of male and female electrical connectors 114, 112 (e.g., that connect to a second solar power module).

The power converter node 100 also includes at its first end a pair of female power-with-Ethernet (PWE) connectors 120. According to various embodiments, the female PWE connectors 120 are configured to be secured to a power-with-Ethernet cable 200 in order to provide an electrical and data communication connection between the power converter nodes 100 and the GIB 300. In addition, the second end of the power converter node 100 further includes a pair of male power-with-Ethernet (PWE) connectors 130. Like the female PWE connectors 120, the male PWE connectors 130 are configured to be secured to a power-with-Ethernet cable 200 in order to provide an electrical and data communication connection between the power converter nodes 100 and the GIB 300. Various features of the PWE connectors 120, 130 are described in greater detail herein with respect to FIGS. 6-8.

Figure 5:
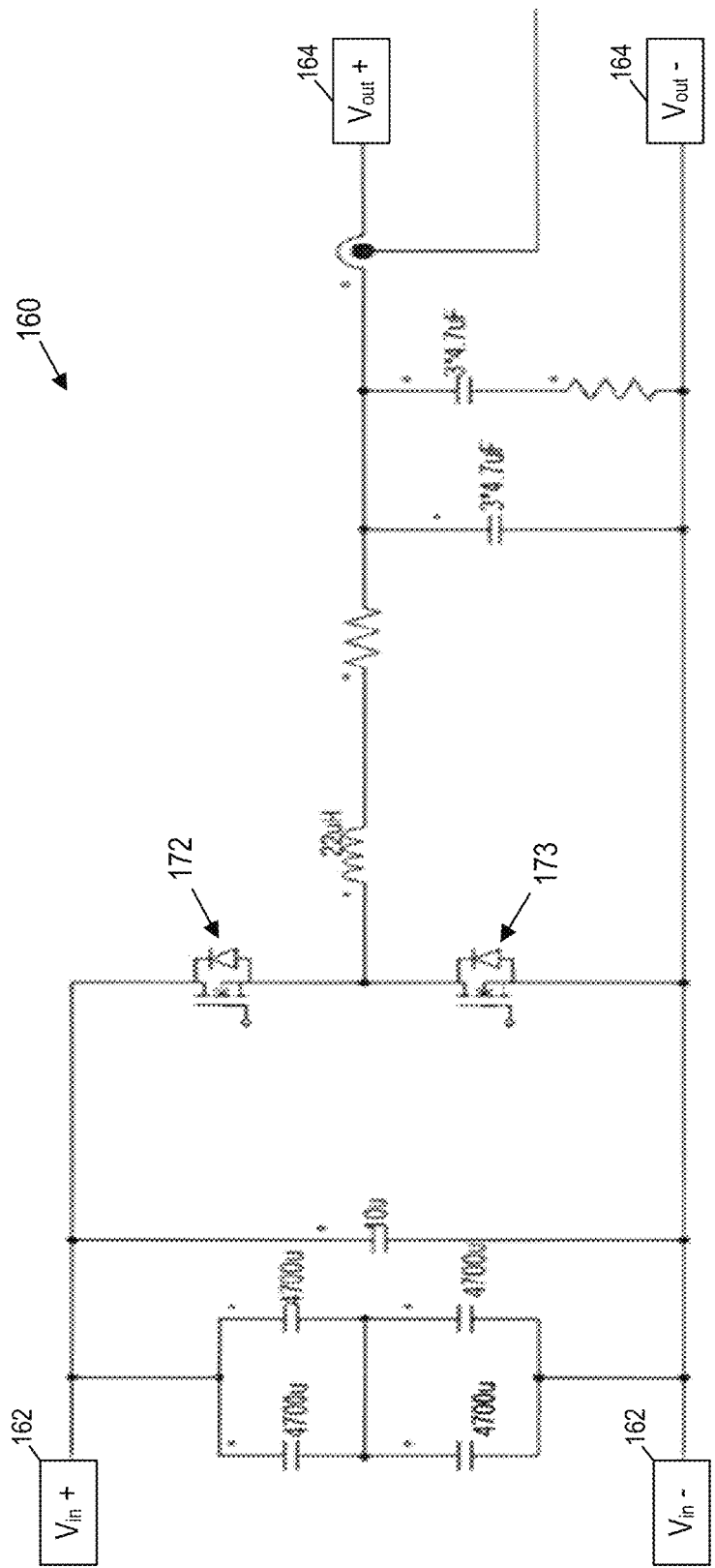
FIG. 5 shows a circuit diagram of deadband converter circuit provided within a power converter node according to one embodiment.

FIG. 5 shows a circuit diagram of deadband converter circuit 160 provided within the power converter node 100 according to one embodiment. According to various embodiments, the deadband power converter circuit 160 is a DC-DC converter disposed within the power converter node's housing 102. On the left side of the FIG. 5's circuit diagram, the circuit 160 includes a pair of voltage inputs 162 (positive and negative). In the illustrated embodiment, the voltage inputs 162 are electrically connected to one of power converter node's pairs of electrical connectors 112, 114.

Power received through the voltage inputs 162 is routed to a pair of switching transistors 172, 173, which are configured to regulate power flow through the circuit 160. By varying the switching times of the transistors 172, 173, the circuit 160 is able to transform the flat DC waveform received from a solar module 5 into a shaped DC waveform having deadbands (e.g., as shown in FIGS. 3A and 3B). The deadband DC waveform is then output from the circuit via a pair of voltage outputs 164 (positive and negative). In the illustrated embodiment, the voltage outputs 164 are electrically connected to power connector contacts in one of the power converter node's PWE connectors 120, 130. In particular, as discussed in more detail herein, the embodiment shown in FIG. 4 includes two independent node circuits (e.g., of the type shown in FIG. 5) within the housing 102. Each circuit uses a set of inputs from the solar module 112, 114, input from a PWE connector 120, and an output from a PWE connector 130. The two circuits are completely independent and can be connected to each other externally in either series or parallel by means of the external PWE cable 200. To connect the circuits in series, a single loopback jumper can be used (e.g., as shown on the second node 100 from the left in FIG. 2). To connect the two circuits in parallel, two sets of jumpers can be used on both sets of connectors (120, 130) (e.g., as shown on the second node from the right in FIG. 2).

In the illustrated embodiment of FIGS. 2-5, the power converter nodes 100 are each rated, for example, to handle 300 W of power from each of the solar modules 5. However, in various other embodiments, the power converter nodes 100 can be configured to handle additional power (e.g., 400-800 W). In one embodiment, the deadband DC waveform generated by the power converter nodes 100 is configured to have deadbands 404 each having a pulse width of approximately 100 microseconds and occurring every 8.33 milliseconds (e.g., in a 60 hz signal).

Additionally, according to certain embodiments, the frequency and widths of the deadbands 404 can be adjusted by the transistors 172, 173. For example, in certain embodiments, the deadbands 404 can be adjusted for time length such that power transmission is optimized and, as line voltage increases, the deadband width may be increased.

Figure 6:
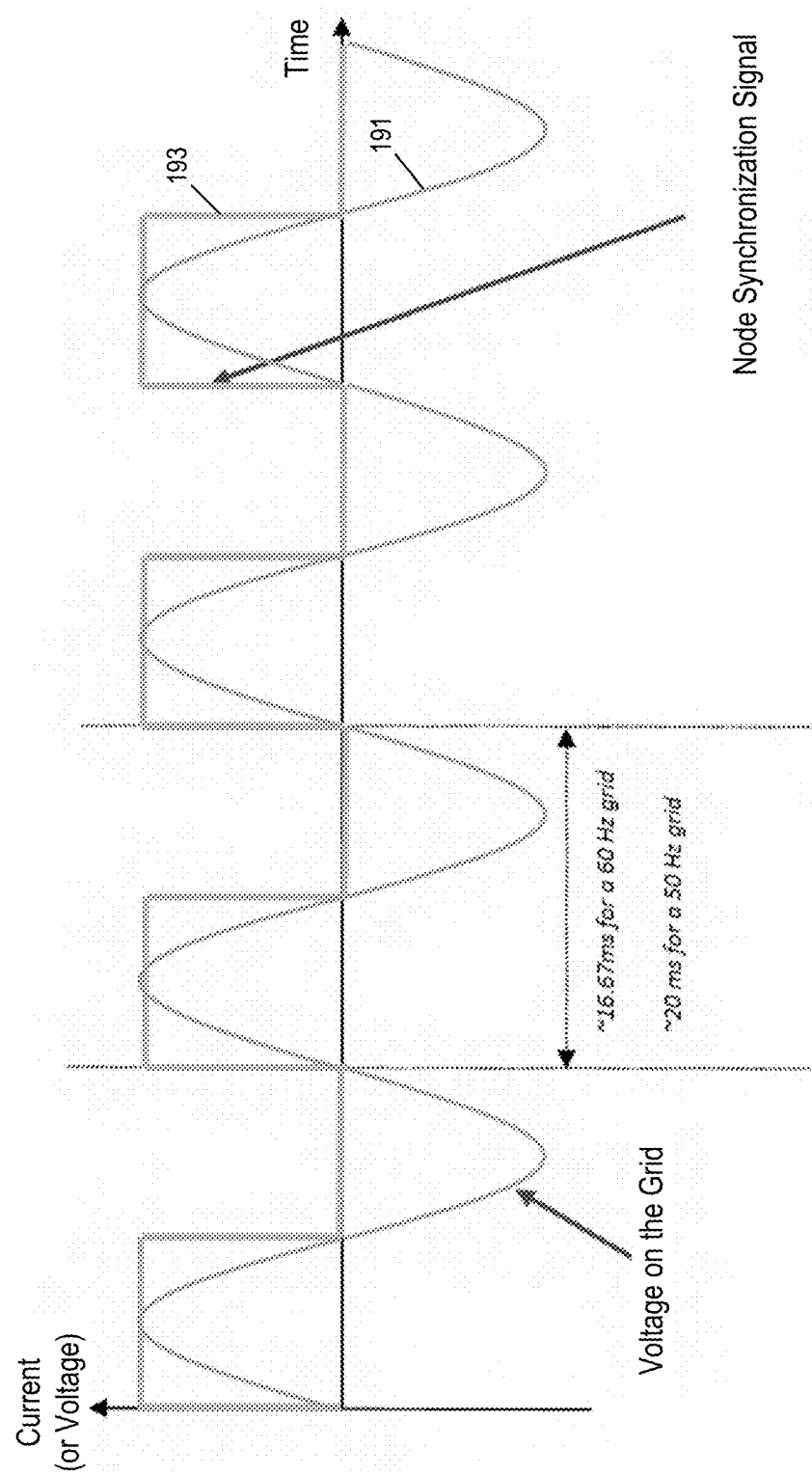
FIG. 6 shows a grid sine wave and a corresponding node synchronization signal generated by a grid interface box according to one embodiment.

According to various embodiments, the deadband converter circuit 160 is also configured to synchronize its deadband DC waveform to the electric grid. As explained in greater detail below, the solar power generation system's GIB 300 is configured to monitor the sinusoidal voltage on the electric grid and identify zero crossings in the voltage (e.g., detected by a change in polarity of the monitored voltage). When a zero crossing of the grid sine wave is detected, the GIB generates a transition in either voltage or current in a synchronization wire provided in the PWE cable 200. For example, the GIB could transition from low voltage to high voltage or high voltage to low voltage. If a current signal is utilized instead of a voltage signal, then a transition from high current to low current or vice versa is utilized. As an example, FIG. 6 illustrates an example of a grid sine wave 191 and a corresponding node synchronization signal 191 generated by the GIB 300.

According to various embodiments, each power converter node 100 in the system monitors a signal line in the PWE cable 200 for transitions. When a transition in either voltage or current is detected on the synchronization wire, a node 100 starts generating a rectified deadband waveform to feed to the GIB 300. In this way, all of the distributed power converter nodes 100 can be synchronized to the electric grid.

In the power converter node 100 embodiment shown and described with respect to FIGS. 4 and 5, the power converter node 100 includes a pair of deadband converter circuits 160. Referring for example to FIG. 4, the voltage inputs 162 of a first circuit 160 are electrically connected to a first pair of the node's electrical connectors 112, 114, while the voltage inputs 162 of a second circuit 160 are connected to the other of the node's electrical connectors 112, 114. Likewise, the voltage outputs 164 of the first circuit 160 are electrically connected to one of the node's PWE connectors 120, 130, while the voltage outputs 164 of a second circuit 160 are connected to the other of the PWE connectors 120, 130. As a result, the illustrated embodiment of the power converter node 100 is provided with a dual-node architecture. In this embodiment, the dual deadband converter circuits 160 can be arranged in parallel or series via PWE cables 200 connecting the power converter nodes 100 to one another. This is shown, for example, in FIG. 2, which—from left to right—illustrates the first three power converter nodes 100 connected in series by PWE cables 200, while the next three power converter nodes 100 are connected in parallel. In certain embodiments, the PWE connectors 130 can be configured as inputs from other power converter nodes 100, while the PWE connectors 120 can be configured as outputs.

Figure 7:
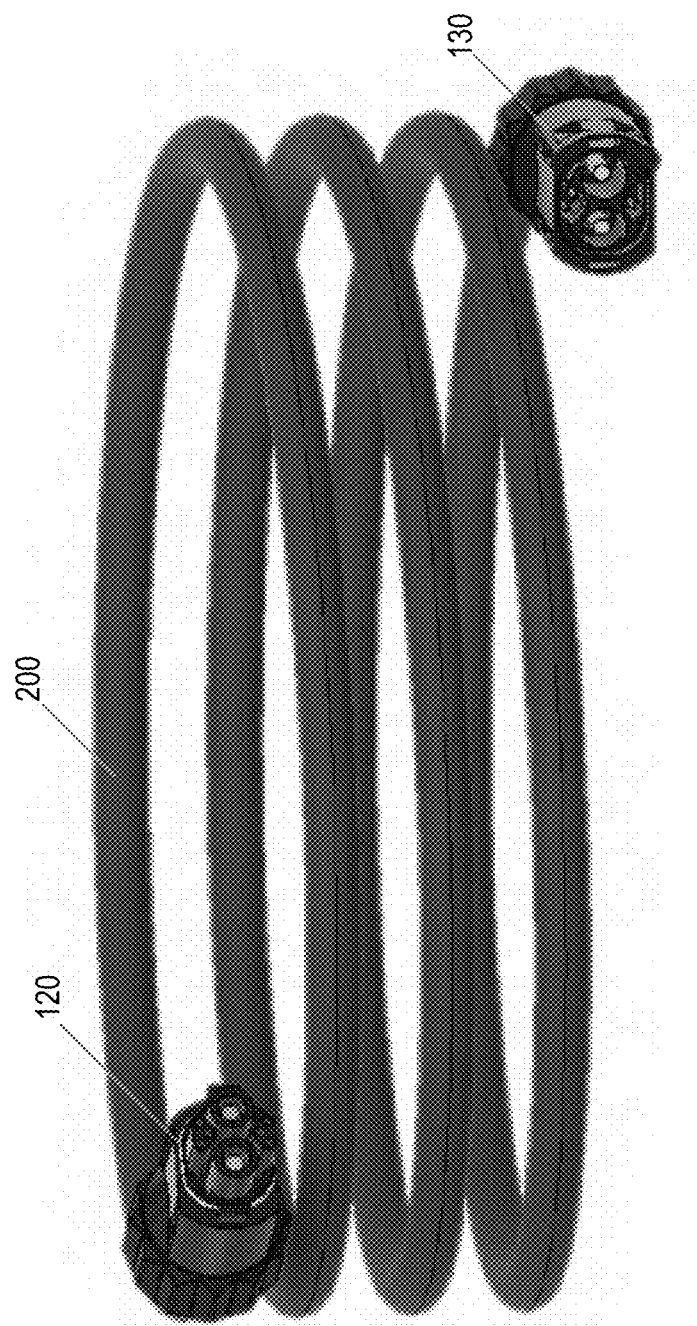
FIG. 7 shows a power-with-Ethernet cable according to one embodiment.

As noted earlier with respect to FIG. 2, the power converter nodes 100 are connected to one another—and to the GIB 300—by PWE cables 200. FIG. 7 shows a PWE cable 200 according to one embodiment. As shown in FIG. 7, each PWE cable 200 includes a female PWE connector 120 at one end and a male PWE connector 130 at the opposite end.

According to various embodiments, each PWE cable 200 is comprised of two power conductors, two twisted pairs of conductors for data communication, and two additional untwisted data communication conductors. FIGS. 8A and 8B illustrate cross-sectional and isometric cut-away views of the PWE cable 200, respectively, according to one embodiment. As shown in FIG. 8A, the PWE cable 200 includes two power conductors 202 positioned adjacent to one another, two twisted pairs of conductors for data communication 204 positioned on opposite sides of the power conductors 202, and two additional untwisted data communication conductors 208. In the illustrated embodiment, the power conductors 202 are AWG 12 7 strand copper wires coated with a protective material (e.g., PVC or HDPE insulation). Additionally, in the illustrated embodiment, the twisted pair data communication conductors 204 and untwisted data communication conductors 208 are AWG 24 solid copper wires coated with a protective material (e.g., PVC or HDPE insulation). As shown in FIGS. 8A and 8B, the power conductors 202, twisted pairs of data communication conductors 204, and untwisted data communication conductors 208 wrapped with a protective wrap 212 (e.g., a thin polyester wrap) and positioned within a cable jacket 210 (e.g., PVC, PE, or TPE cable jacket). In the illustrated embodiment of FIGS. 8A and 8B, the combination of cables 202, 204, and 208 enables a round cable (e.g., as can be seen from the cross-sectional view of FIG. 8A).

According to various embodiments, the PWE cable's power conductors 202 are configured to transmit the deadband DC power generated by the respective power converter nodes 100 throughout the solar power generation system. Separately, the twisted pairs of data communication conductors 204 and untwisted data communication conductors 208 are configured to enable data communication the between the power converter nodes 100 and the GIB 300. For example, in one embodiment, the node synchronization signal 193 (shown in FIG. 6) generated by the GIB 300 can be transmitted to the various power converter nodes 100 via the untwisted data communication conductors 208 (or, alternatively, via the twisted pairs of data communication conductors 204). Additional data communication, such as for the purpose of monitoring the performance of the power converter nodes 100 and their respective solar modules 5, can be transmitted along the remaining untwisted data communication conductors 204, 208. In various embodiments, by providing separate, isolated conductors for power and data communication, the power generated by the power converter nodes 100 can be distributed uninterrupted along the PWE cables 200 to the GIB 300.

Figure 9B:
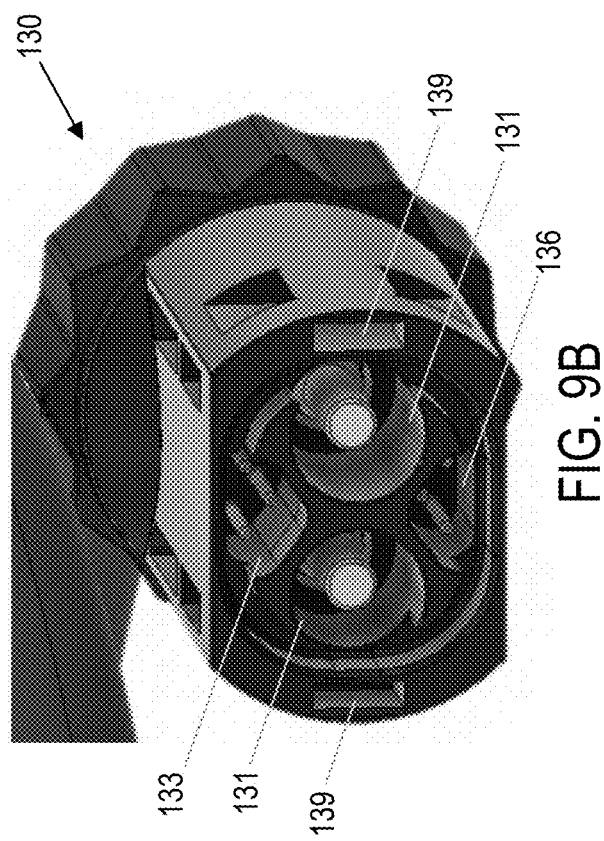
FIGS. 9A and 9B show female and male power-with-Ethernet cable connectors, respectively, according to one embodiment.
Figure 9A:
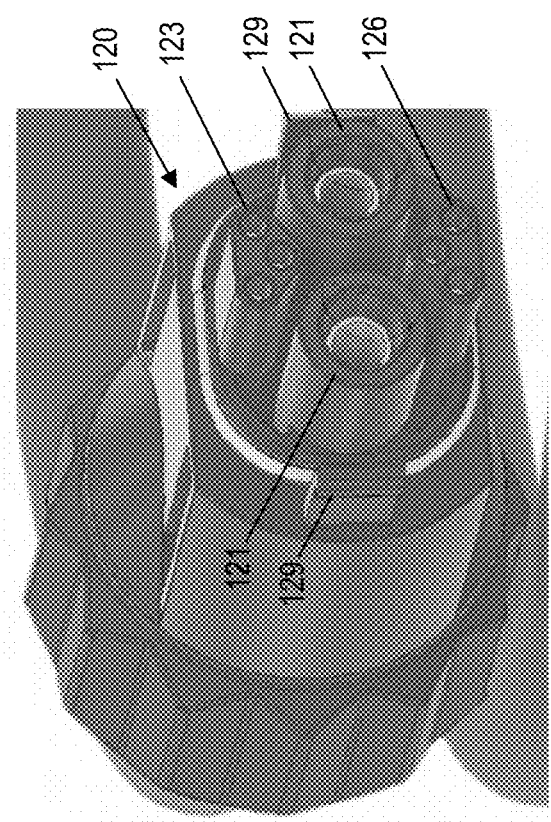

The PWE cable's female and male PWE connectors 120, 130 are shown in FIGS. 9A and 9B according to one embodiment. As shown in FIG. 9A, the female PWE connector 120 includes a pair of power connector protrusions 121, which extend outwardly from the connector and are laterally spaced from one another. According to various embodiments, the power connector protrusions 121 include electrical contacts disposed in a recessed fashion within the protrusions and that are electrically connected to the PWE cable's power cables 202.

The female PWE connector 120 also includes an upper data connector protrusion 123 and a lower data connector protrusion 126. Both the upper and lower data connector protrusions extend outwardly from the connector 120 and disposed at least partially between the power connector protrusions 121. As shown in FIG. 9A, the upper data connector protrusion 123 includes three electrical contacts disposed in a recessed fashion within the upper data connector protrusion 123. According to various embodiments, two of the upper data connector's electrical contacts are electrically connected to one of the PWE cable's twisted pairs of data communication conductors 204, while the third of the upper data connector's electrical contacts are electrically connected to one of the PWE's cables untwisted data communication conductors 208. In particular, in the illustrated embodiment, the upper data connector protrusion's three electrical contacts are arranged in a triangle, with two of the electrical contacts disposed laterally adjacent to one another and the third electrical contact disposed below and between the first two electrical contacts. Specifically, in the illustrated embodiment, the lower electrical contact is positioned partially between the power connector protrusions 121.

Likewise, the lower data connector protrusion 126 includes three electrical contacts disposed in a recessed fashion within the lower data connector protrusion 126. According to various embodiments, two of the lower data connector's electrical contacts are electrically connected to one of the PWE cable's twisted pairs of data communication conductors 204, while the third of the upper data connector's electrical contacts are electrically connected to one of the PWE's cables untwisted data communication conductors 208. In particular, in the illustrated embodiment, the lower data connector protrusion's three electrical contacts are arranged in a triangle, with two of the electrical contacts disposed laterally adjacent to one another and the third electrical contact disposed above and between the first two electrical contacts. Specifically, in the illustrated embodiment, the upper electrical contact is positioned partially between the power connector protrusions 121.

The female PWE connector 120 also includes a pair of laterally disposed fastener tabs 129. As shown in FIG. 9A, the fastener tabs 129 are generally thin, resilient tabs extending outwardly from lateral sides of the connector, adjacent outer portions of the power connector protrusions 121. As discussed in greater detail below, the fastener tabs 129 are configured to engage the male PWE connector 130 and enable the connectors 120, 130 to be selectively and removably secured to one another.

As shown in FIG. 9B, the male PWE connector 130 includes a pair of power connector cavities 131, which extend inwardly into the connector and are laterally spaced from one another. According to various embodiments, the power connector cavities 131 include protruding electrical contacts disposed centrally within the cavities and that are electrically connected to the PWE cable's power conductors 202. In particular, the power connector cavities 131 are dimensioned to receive the power connector protrusions 121 of the female PWE connector 120 such that the male connectors' power connector electrical contacts are inserted within the female connector's power connector contacts, thereby electrically connecting the power portions of the contacts 120, 130.

The male PWE connector 130 also includes an upper data connector cavity 133 and a lower data connector cavity 136. As shown in FIG. 9B, the upper data connector cavity 133 includes three protruding electrical contacts disposed within the upper data connector cavity 133 and arranged in triangular pattern. According to various embodiments, two of the upper data connector cavity's protruding electrical contacts are electrically connected to one of the PWE cable's twisted pairs of data communication conductors 204, while the third of the upper data connector cavity's electrical contacts are electrically connected to one of the PWE's cables untwisted data communication conductors 208. In particular, the upper data connector cavity 133 is dimensioned to receive the upper data connector protrusion 123 of the female PWE connector 120 such that the male connector's data connector electrical contacts are inserted within the female connector's data connector electrical contacts, thereby connecting the data portions of the contacts 120, 130.

Likewise, the lower data connector cavity 136 includes three protruding electrical contacts disposed within the lower data connector cavity 136 and arranged in triangular pattern. According to various embodiments, two of the lower data connector cavity's protruding electrical contacts are electrically connected to one of the PWE cable's twisted pairs of data communication conductors 204, while the third of the upper data connector cavity's electrical contacts is electrically connected to one of the PWE's cables untwisted data communication conductors 208. In particular, the lower data connector cavity 136 is dimensioned to receive the lower data connector protrusion 126 of the female PWE connector 120 such that the male connector's data connector electrical contacts are inserted within the female connector's data connector electrical contacts, thereby connecting the data portions of the contacts 120, 130.

The male PWE connector 130 also includes a pair of laterally disposed fastener cavities 139. As shown in FIG. 9B, the fastener cavities 139 are positioned adjacent outer portions of the power connector cavities 131. In various embodiments, the fastener cavities 139 are dimensioned to engage the resilient fastener tabs 129 of the female PWE connector 120 when the fastener tabs 129 are inserted within the fastener cavities 139. In this way, the connectors 120, 130 to be selectively and removably secured to one another.

According to various embodiments, based on the design and configuration of the power converter nodes 100, the PWE cable 200 may be provided without the twisted pairs of data communication conductors 204 (e.g., in simple embodiments where the data communication provided by the cables is not necessary).

According to various embodiments, the grid interface box (GIB) 300 is configured to unfold the deadband DC power generated by the power converter nodes 100 into an AC signal suitable for transmission to an electric power grid. In addition, the GIB 300 serves as a communications gateway, enabling data transmission between the power converter nodes 100 and remote systems outside of the solar power generation system (e.g., remote computers or other devices). As discussed in detail below, the GIB 300 is also provided with a modular configuration that allows it to be easily scaled up (or down) to accommodate various solar power generation environments, including residential, commercial, and utility scale applications.

Figure 10:
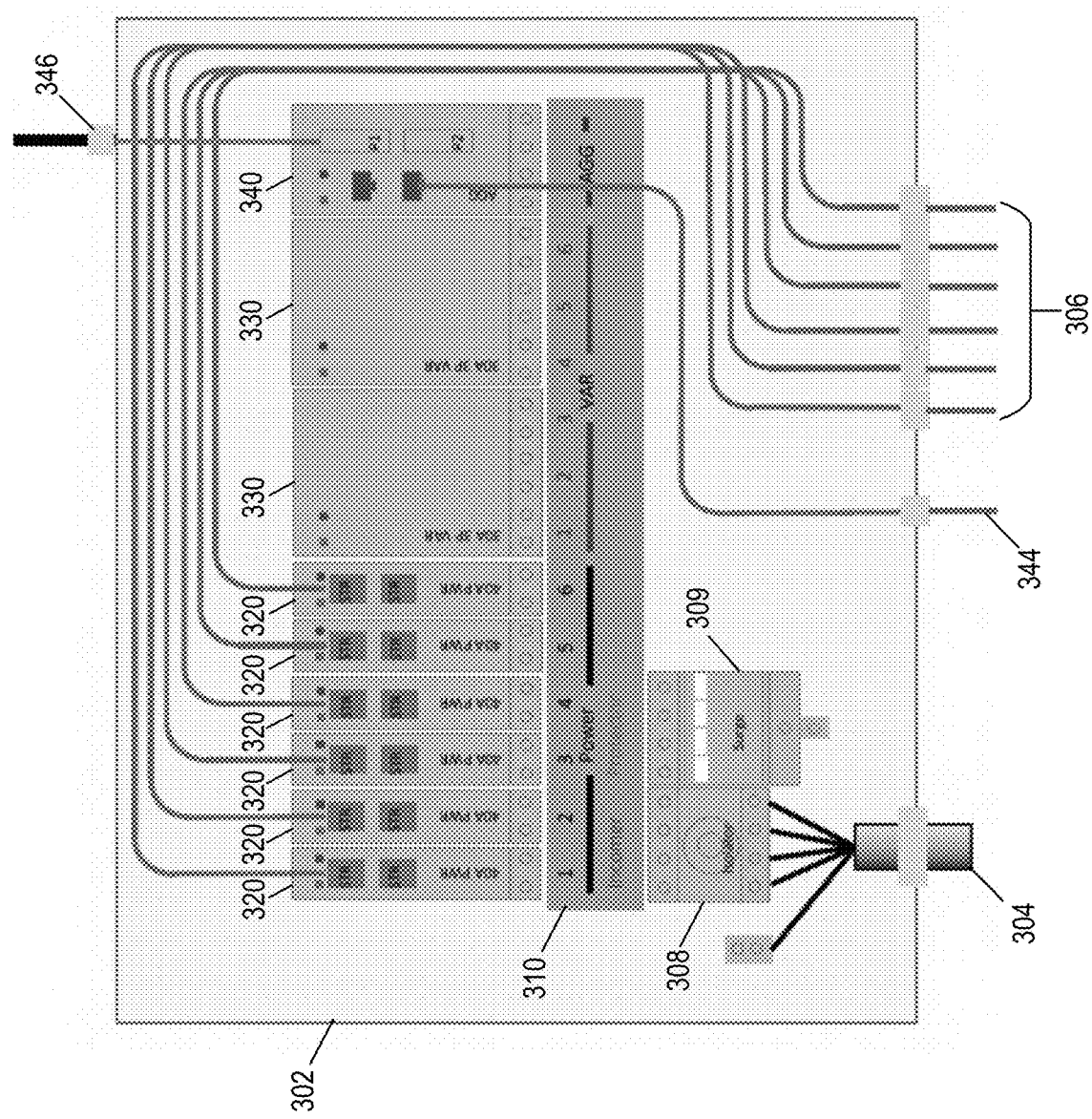
FIG. 10 shows a schematic diagram of a grid interface box (GIB) according to one embodiment.
Figure 11B:
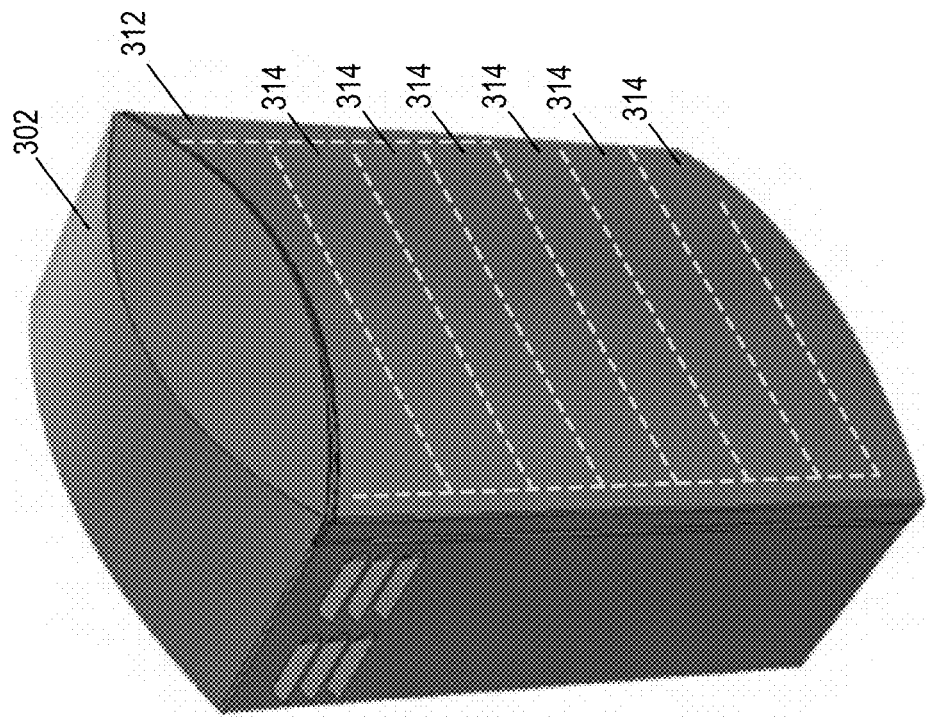
FIGS. 11A and 11B show isometric views of a grid interface box chassis according to one embodiment.
Figure 11A:
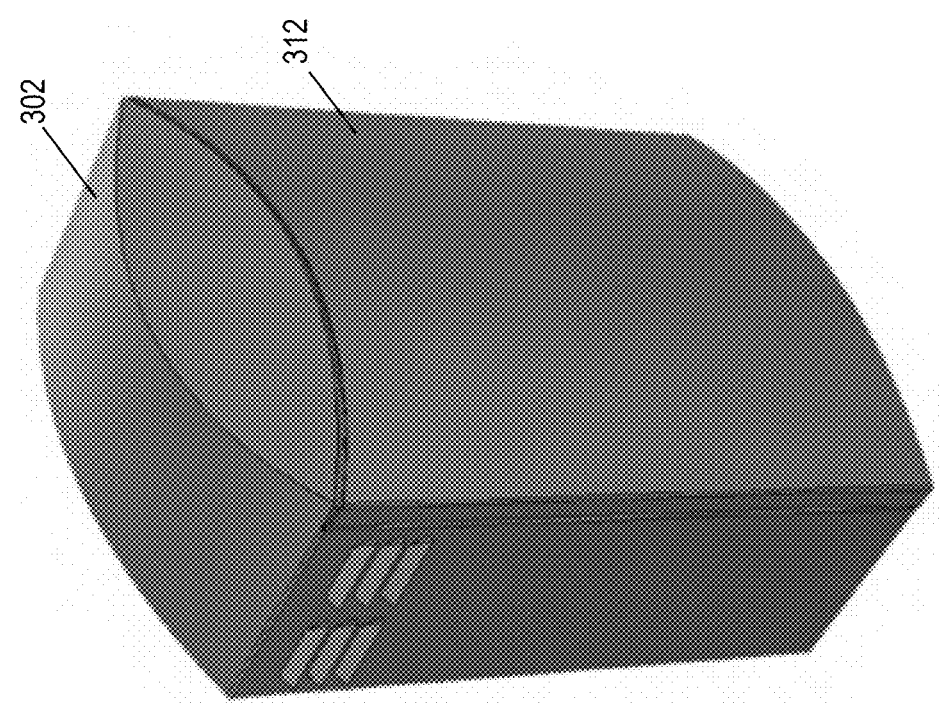

FIG. 10 shows a schematic diagram of the grid interface box (GIB) 300 according to one embodiment. As shown in FIG. 10, the GIB 300 is comprised of a chassis 302, which is configured for housing a plurality of removable power modules 320, VAR modules 330, and at least one aggregator module 340. FIGS. 11A and 11B show the GIB chassis 302 in isolation according to one embodiment. As shown in FIG. 11A, the GIB chassis 302 includes a door 312, which can be open and closed to access the interior portion of the chassis 302. In addition, FIG. 11B illustrates schematically a plurality of slots 314 provided in the interior portion of the chassis 302. According to various embodiments, the slots 314 can be dimensioned to receive and secure the removable modules 320, 330, 340 described herein.

Referring back to FIG. 10, the GIB's chassis 302 further includes an internal bus bar assembly 310, to which the modules 320, 330, 340 can be electrically connected when inserted into the chassis' slots 314. As an example, in one embodiment, the bus bar assembly is comprised of a two molding claim-shell with two, three, or four stamped copper bus bars with 18 mm modularity and a plurality of stabs configured for engaging the modules 320, 330, 340. The chassis also includes a line connection 304 for connecting the GIB 300 to an electric grid. The line connection wiring may enter, for example, through the bottom of the chassis 302 through standard cable glands and knockouts. The GIB 300 also includes a plurality of string connectors 306, which facilitate connection of the power modules 320 within the GIB to strings of power converters 100 (as shown, for example, in FIG. 2). As one example, the string connectors 306 may enter the GIB chassis 302 through dedicated cable glands with split rubber grommets. The line connection 304 is also routed through an isolator 308, which is configured as a disconnect switch. The GIB also includes a surge arrestor block 309 (e.g., for plug in Varistor and Discharge Tube Modules).

According to various embodiments, the GIB 300 is also configured with anti-islanding functionality to disable the GIB when it detects that the electric grid has entered an islanded condition.

According to various embodiments, the GIB's power modules 320 are generally configured to unfold the deadband DC power transmitted by the power converter nodes 100 to the GIB 300 in order to convert that signal into AC power. The resulting AC power is then delivered to an electric grid via the line connection 304. In the illustrated embodiment of FIG. 2, for example, the power modules 320 are configured to convert to AC in a 3-phase power system. However, in various other embodiments, the power modules 320 may be configured to convert to AC in a single-phase or split-phase power system. In particular, the power modules may be configured to function for both 120V and 240V systems.

Figure 12:
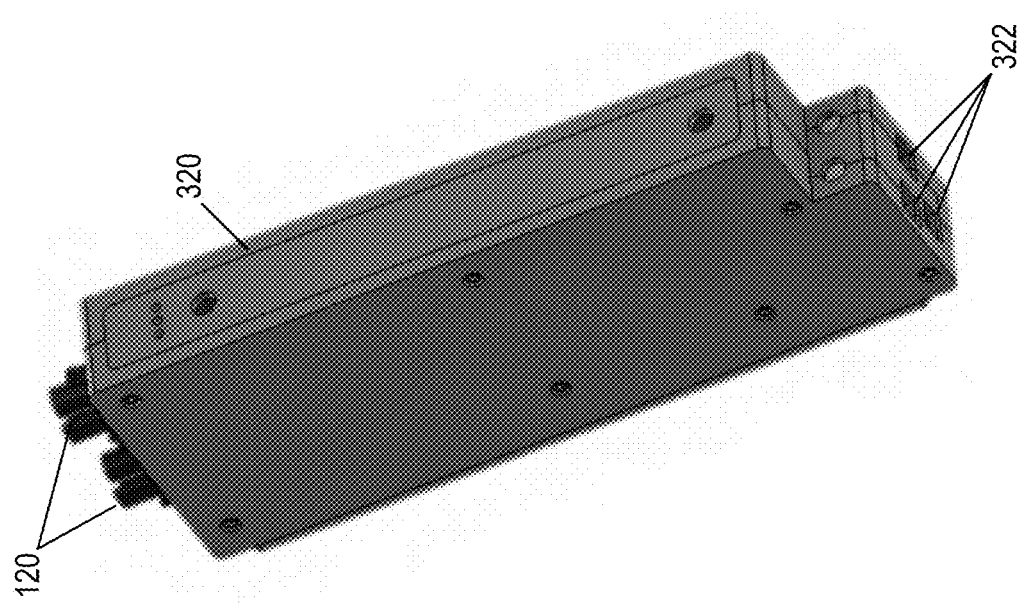
FIG. 12 illustrates a power module according to one embodiment.

FIG. 12 illustrates a single power module 320 according to one embodiment. As shown in FIG. 12, power module 320 includes a pair of PWE connectors 120 at its upper end, which facilitate connection to the string connectors 306 feeding power from a string of power converter nodes 100. In addition, the power module 320 includes a plurality of electrical contacts 322 at its opposite end, which are configured to interface with the tabs of the GIB's bus bar assembly 310. In other words, when the power module 320 is inserted into one of the GIB's slots 314, the bus bar assembly's tabs will be inserted into the electrical contacts 322 of the power module 320, thereby electrically connecting the power module 320 with the remaining GIB components.

As discussed earlier herein in relation to FIG. 3A, in one embodiment the power converter nodes 100 are configured to generated a deadband DC waveform 402 shaped as a rectified sinewave. As a result, the GIB's power modules 320 are configured to invert the waveform 402 by inverting every other pulse in the waveform 402, which are easily identifiable from the deadband periods 404. Additionally, as discussed earlier herein, the GIB is configured to monitor the grid voltage (e.g., via the line connection 304) in order to generate a synchronization signal transmitted to the power converter nodes 100 (e.g., via the string connectors 306 and PWE cables 200). As a result, the deadband DC waveform received and inverted by the GIB is already synchronized to the electric grid. Moreover, because the GIB 300 is powered by the grid, if a particular power converter node 100 loses power, the GIB's synchronization signal will still be transmitted to the remaining operational nodes 100, thereby ensuring synchronized AC output in phase with the utility grid AC phase.

According to various embodiments, the power module 320 may be configured to process various amounts of power. In the illustrated embodiment of FIGS. 2 and 10, for example, the power modules 320 are each 40 A power modules rated at 10 kW. Furthermore, in the illustrate embodiment of FIGS. 2 and 10, six power modules 320 are provided in the slots 314 of the GIB 300 and are secured to the bus bar assembly 310. As a result, the GIB 300 is shown in a configuration scaled to handle 60 kW of power.

According to various embodiments, the GIB's VAR modules 330 are generally configured to adjust the amount of reactive power that is supplied to the grid. Many utilities demand that power that is injected into the grid be power factor adjustable. To adjust the power factor of injected power, the inverter can exert control over its "real" or "active" power (measured in kW) and its reactive power (measured in Volt Amps Reactive or VARs). The GIB provides the desired about of "real" power to the grid while the VAR module 330 supplies reactive power to the grid. In order to adjust the power factor to the desired level, a VAR module 330 is generally provided for each power module 320 inserted into the GIB 330.

Figure 13:
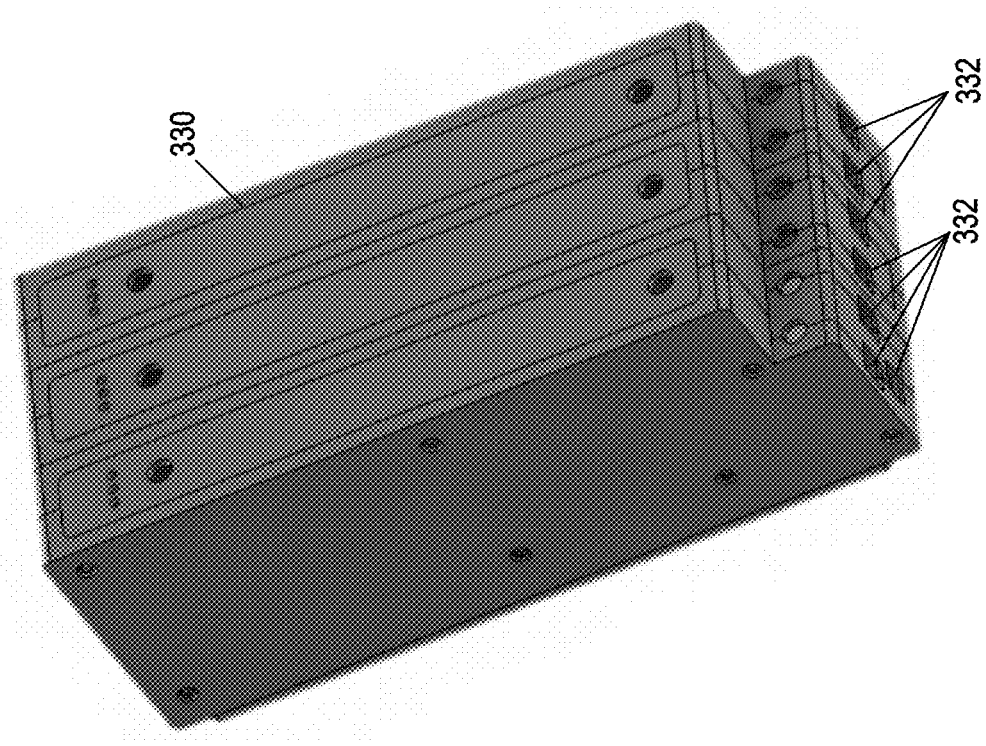
FIG. 13 illustrates a VAR modules according to one embodiment.

FIG. 13 illustrates a VAR module 330 according to one embodiment. As shown in FIG. 13, the VAR module 330 includes a plurality of electrical contacts 332, which are configured to interface with the tabs of the GIB's bus bar assembly 310. In other words, when the VAR module 330 is inserted into one of the GIB's slots 314, the bus bar assembly's tabs will be inserted into the electrical contacts 332 of the VAR module 330, thereby electrically connecting the VAR module 330 with the remaining GIB components. In the embodiment shown in FIG. 13, the VAR module is a combined 3-phase module, essentially consisting of three 30 A VAR modules joined together. As a result, each VAR module 330 of the type shown in FIG. 13 is configured to perform power factor correction for three power modules 320 in the GIB 300.

As will be appreciated from the description herein, the GIB 300 can be scaled to handle various thresholds of power by adding or removing power modules 320 and VAR modules 330. For example, as noted above, the GIB 300 shown in FIGS. 2 and 10 includes six power and VAR modules 320, 330 and is therefore rated at 60 kW. However, by including only three power modules 320 and VAR modules 330, for example, the GIB 300 rating could be scaled back to 30 kW. The opposite would be true by adding additional power and VAR modules 320, 330. As a result, the modular configuration of the GIB 300—which enables the power and VAR modules 320, 330 to be easily added or removed from the GIB chassis—allows for the GIB to be easily scaled up (or down) to accommodate various solar power generation environments, including residential (e.g., 10 kW), commercial (e.g., 30-60 kW), and utility scale (e.g., 120 kW+) applications.

According to various embodiments, the GIB's aggregator module 340 is configured to control the operation of the GIB 300 and function as a communications gateway between the remaining components of the solar power generation system (e.g., power converter nodes 100) and remote devices (e.g., computers configured for interoperability with the GIB 300). In the illustrated embodiment of the FIGS. 2 and 10, the aggregator module 340 includes at least one dedicated processor and associated memory storage for running software and applications related to the GIB's functionality. In particular, the aggregator module 340 is configured to send and receive data from the power converter nodes 100 and power modules 320 via the bus bar assembly 310 and the various PWE cables 200 connecting the nodes 100 to the GIB 300. In addition, the aggregator module 340 includes a Wi-Fi antenna 346, which is configured to provide communication with the aggregator module 340 over a wireless internet network, and an Ethernet uplink 344, which is configured to provide communication with the aggregator module 340 over a dedicated network.

Figure 14:
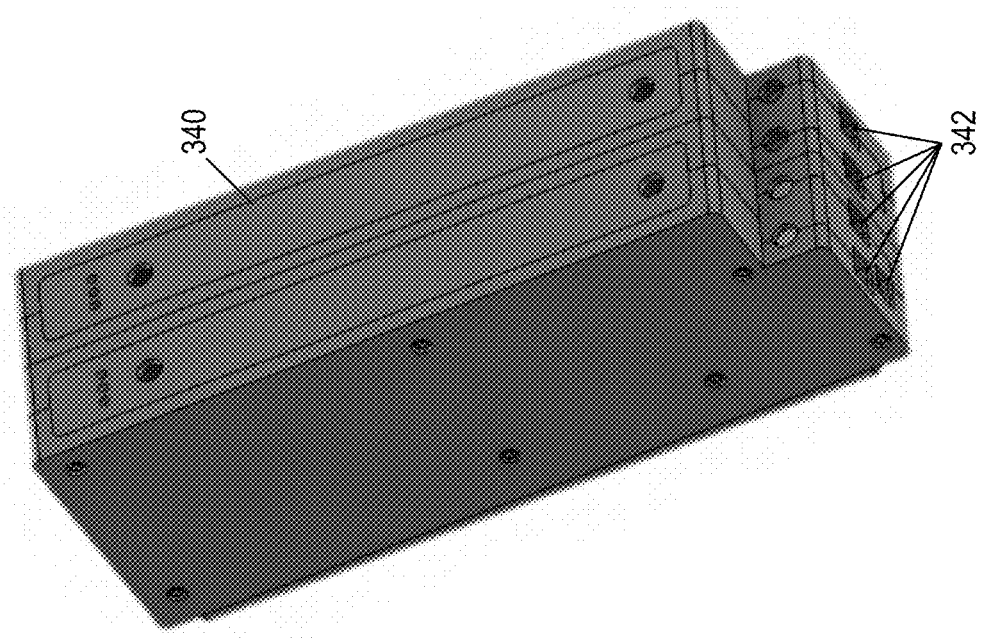
FIG. 14 illustrates an aggregator module according to one embodiment.

FIG. 14 illustrates an aggregator module 340 according to one embodiment. As shown in FIG. 14, the aggregator module 340 includes a plurality of electrical contacts 342, which are configured to interface with the tabs of the GIB's bus bar assembly 310. In other words, when the aggregator module 340 is inserted into the GIB, the bus bar assembly's tabs will be inserted into the electrical contacts 342 of the aggregator module 340, thereby electrically connecting the aggregator module 340 with the remaining GIB components.

In various embodiments, the aggregator module 340 is configured to function as a bridge for internal and external network connectivity, handle supervisory control and data acquisition operations from the grid, and collect and perform edge mining on all sensor data (e.g., collected from the power converter nodes 100), and to host installer and maintainer applications. The aggregator also provides system wide control functions to shut down or scale back output when external commands (e.g., from the utility) are received.

Figure 15:
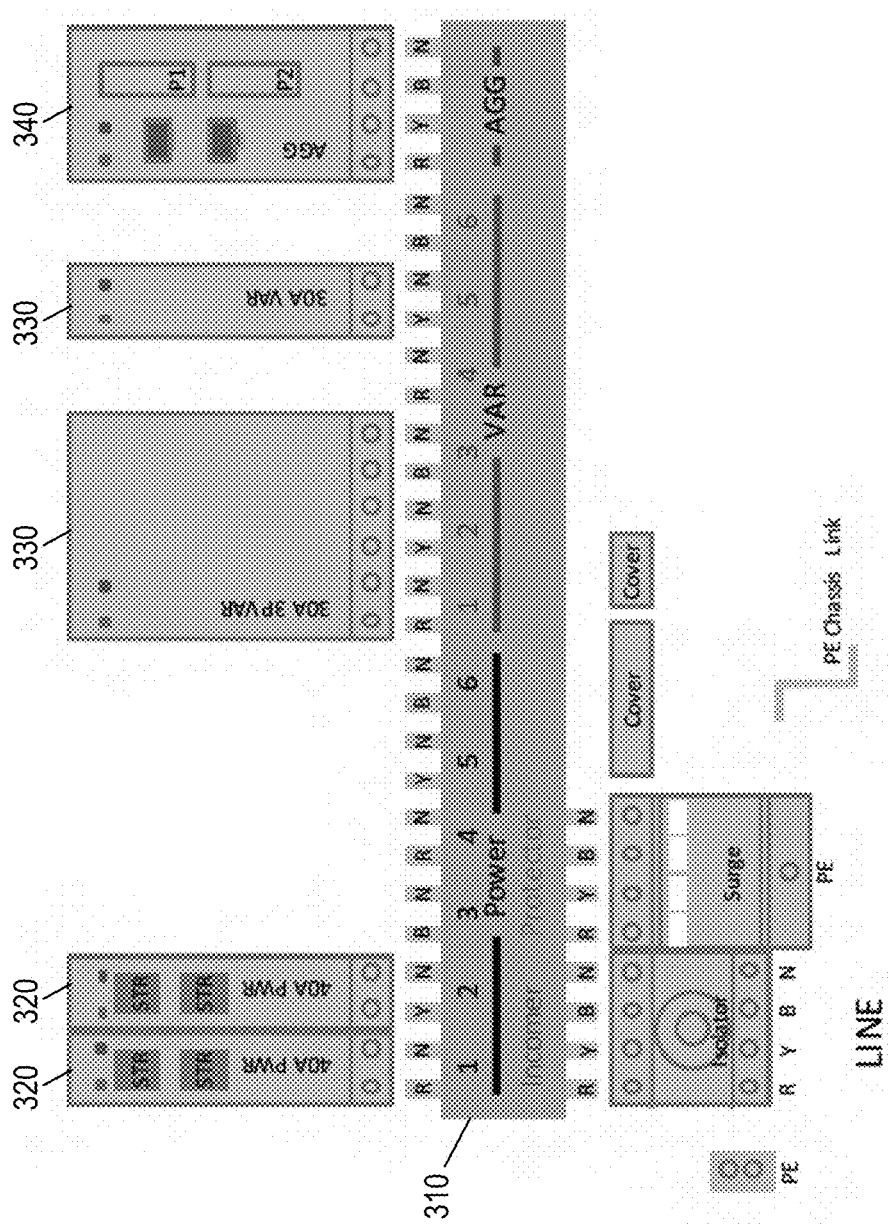
FIG. 15 shows a schematic diagram of a grid interface box having a 3-phase WYE configuration according to one embodiment.
Figure 16:
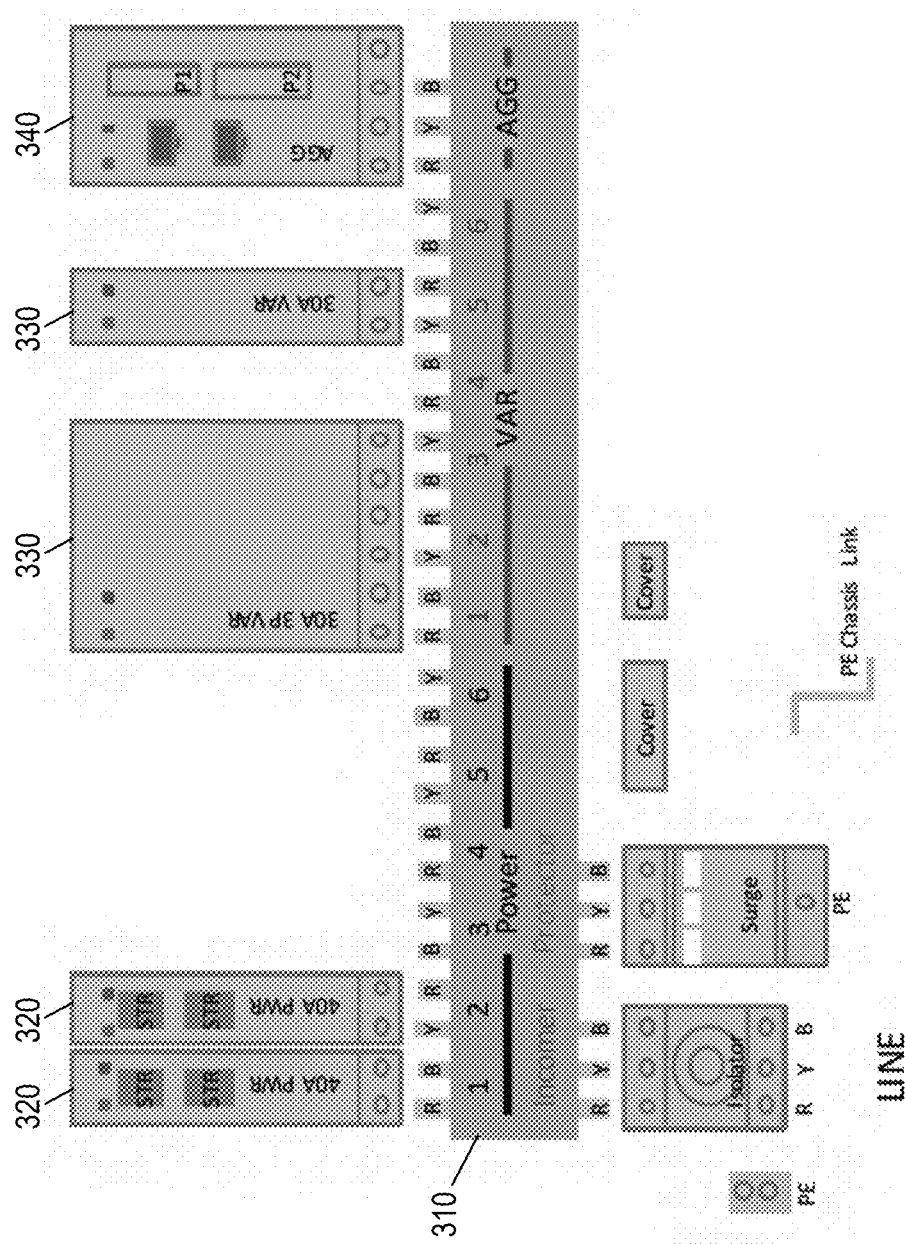
FIG. 16 shows a schematic diagram of a grid interface box having a 3-phase delta configuration according to one embodiment.
Figure 17:
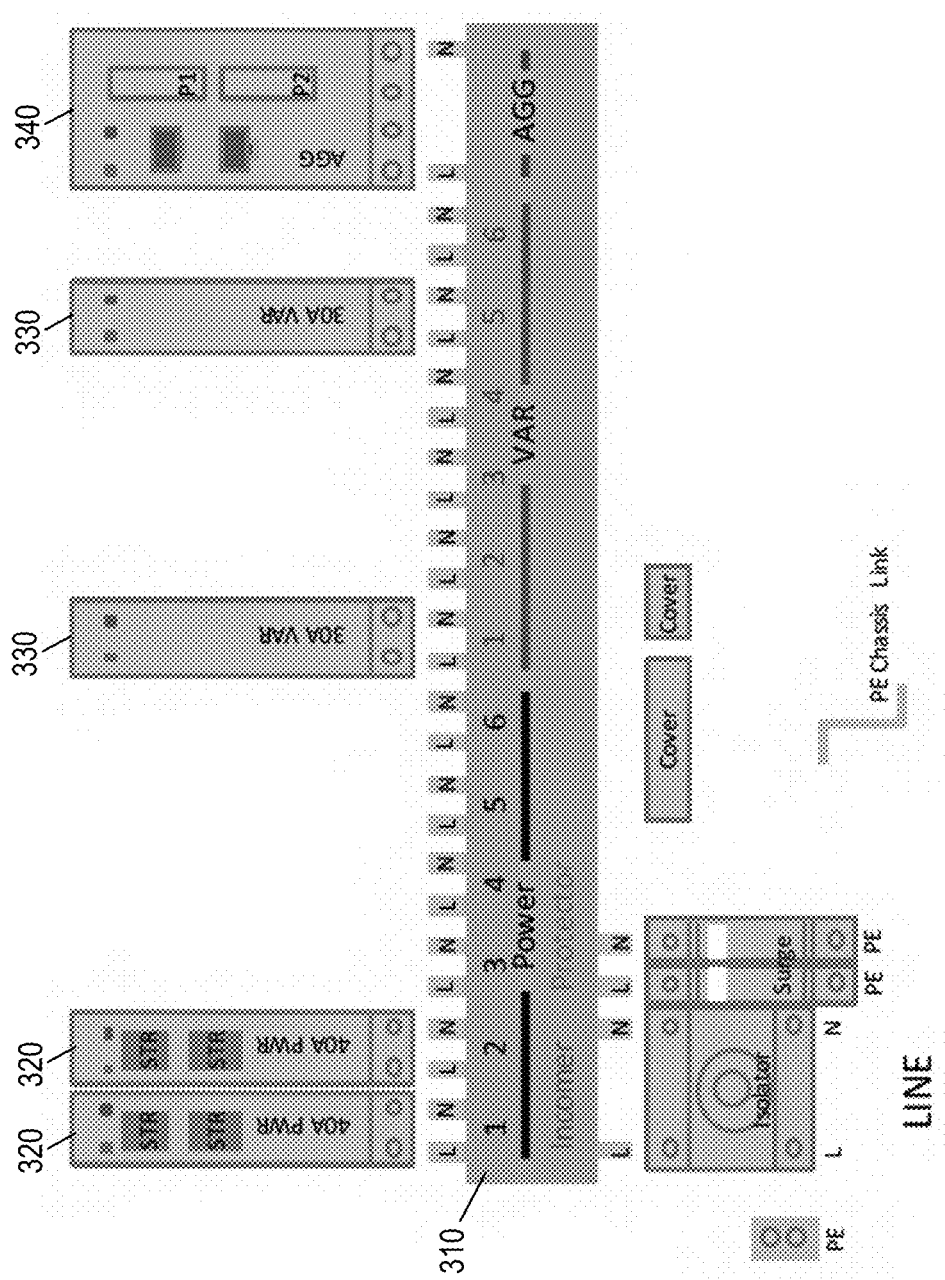
FIG. 17 shows a schematic diagram of a grid interface box having a single phase configuration according to one embodiment.

As discussed earlier herein, the GIB 300 can be configured to convert to AC in a 3-phase power system or single (or split-phase) power system at 120V or 240V. As examples, FIG. 15 shows the GIB 300 in a 3-phase WYE configuration, FIG. 16 shows the GIB 300 in a 3-phase delta configuration, and FIG. 17 shows the GIB 300 in a single-phase configuration.

While this specification contains many specific embodiment details, these should not be construed as limitations on the scope of any inventions described herein, but rather as descriptions of features specific to particular embodiments of particular inventions. Certain features that are described herein in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations, one or more features from a combination can in some cases be excised from the combination, and the combination may be directed to a sub-combination or variation of a sub-combination.

Moreover, many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the application.

That which is claimed:

1. A solar power generation system comprising:
   a plurality of solar modules each configured for generating a DC power signal;
   a plurality of power converter nodes each configured for receiving a DC power signal from at least one of the plurality of solar modules and converting the DC power signal into a converted power signal comprising deadband DC waveform, wherein the deadband DC waveform includes periods of zero voltage between the waveform's peaks; and
   a grid interface box configured for receiving the converted power signals from the plurality of power converter nodes, unfolding the converted power signals, and outputting AC power to an electric grid;

wherein each power converter node is connected to at least one other power converter node by one or more power-with-ethernet cables; and wherein the one or more power-with-ethernet cables each comprise a jacket, one or more power conductors positioned within the jacket, and one or more data communication conductors positioned within the jacket.

2. The solar power generation system of claim 1, wherein the deadband DC waveform comprises a rectified sinewave.

3. The solar power generation system of claim 1, wherein each of the plurality of power converter nodes includes a deadband converter circuit configured for generating the converted power signal, the deadband converter circuit in communication with a positive voltage input, negative voltage input, positive voltage output, and negative voltage output.

4. The solar power generation system of claim 1, wherein each of the plurality of power converter nodes comprises a first positive voltage input, a first negative voltage input, a first positive voltage output, a first negative voltage output;

a second positive voltage input, a second negative voltage input, a second positive voltage output, and a second negative voltage output.

5. The solar power generation system of claim 4, wherein the first deadband converter circuit and the second deadband converter circuit are configured for being selectively connected in series or parallel via the first and second positive voltage inputs, first and second negative voltage inputs, first and second positive voltage outputs, and first and second negative voltage outputs.

6. The solar power generation system of claim 1, wherein each of the power converter nodes is configured to adjust the frequency and width of the periods of zero voltage in the deadband DC waveform.

7. The solar power generation system of claim 1, wherein the periods of zero voltage in the deadband DC waveform have a pulse width of approximately 100 microseconds and occur approximately every 8.33 milliseconds.

8. The solar power generation system of claim 1, wherein the grid interface box is configured to monitor the sinusoidal voltage on the electric grid, generate a node synchronization signal, and transmit the node synchronization signal to the plurality of power converter nodes; and wherein the plurality of power converter nodes are configured to receive the node synchronization signal and generate converted power signals synchronized to the electric grid.

9. The solar power generation system of claim 1, wherein the grid interface box comprises one or more power modules configured for unfolding the converted power signals received from the plurality of power converters and outputting AC power via a line connection.

10. The solar power generation system of claim 9, wherein the grid interface box further comprises one or more VAR modules configured to adjust the amount of reactive power to the grid via the line connection.

11. The solar power generation system of claim 10, wherein the one or more power modules and one or more VAR modules are configured for being selectively engaged with an internal bus bar provided in the grid interface box and are removable from the grid interface box.

12. The solar power generation system of claim 1,
wherein the one or more data communication conductors are packaged together within a protective wrap.

13. A power converter node configured for converting DC power into a modified DC waveform, the power converter node comprising:
a housing;
one or more input power connectors provided on the housing and configured for receiving a DC power signal;
a converter circuit positioned within the housing and configured for converting the DC power signal into a converted power signal comprising a converted waveform having reoccurring portions of zero voltage between the waveform's peaks; and
one or more output power connectors provided on the housing and configured for outputting the converted power signal generated by the converter circuit, wherein the one or more output power connectors are configured for interfacing with at least one power-with-ethernet cable, wherein the at least one power-with-ethernet cable comprises a jacket, one or more power conductors positioned within the jacket, and one or more data communication conductors positioned within the jacket.

14. The power converter node of claim 13, wherein the converted DC waveform comprises a rectified sinewave having periods of zero voltage between the waveform's peaks.

15. The power converter node of claim 14, the converter circuit is configured to adjust the frequency and width of the periods of zero voltage in the converted DC waveform.

* * * * *